United States Patent
Ueda

(10) Patent No.: US 9,905,611 B2
(45) Date of Patent: Feb. 27, 2018

(54) VARIABLE RESISTANCE MEMORY

(71) Applicant: TOSHIBA MEMORY CORPORATION, Minato-ku, Tokyo (JP)

(72) Inventor: Yoshihiro Ueda, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/065,506

(22) Filed: Mar. 9, 2016

(65) Prior Publication Data

US 2017/0077175 A1    Mar. 16, 2017

Related U.S. Application Data

(60) Provisional application No. 62/217,671, filed on Sep. 11, 2015.

(51) Int. Cl.

| | |
|---|---|
| H01L 27/00 | (2006.01) |
| H01L 27/22 | (2006.01) |
| H01L 23/528 | (2006.01) |
| G11C 11/16 | (2006.01) |
| H01L 27/24 | (2006.01) |

(52) U.S. Cl.
CPC ............ *H01L 27/228* (2013.01); *G11C 11/16* (2013.01); *G11C 11/1653* (2013.01); *G11C 11/1659* (2013.01); *H01L 23/528* (2013.01); *H01L 27/2454* (2013.01)

(58) Field of Classification Search
CPC ....... H01L 27/228; H01L 43/02; H01L 43/08; H01L 23/528
See application file for complete search history.

(56) References Cited

U.S. PATENT DOCUMENTS

| | | | |
|---|---|---|---|
| 2004/0184331 A1 | 9/2004 | Hanzawa et al. | |
| 2005/0122768 A1* | 6/2005 | Fukumoto | B82Y 10/00 365/158 |
| 2008/0209118 A1 | 8/2008 | Kajiyama | |
| 2015/0255514 A1 | 9/2015 | Nakai et al. | |
| 2015/0255515 A1 | 9/2015 | Nakai et al. | |
| 2016/0064452 A1 | 3/2016 | Ueda et al. | |

FOREIGN PATENT DOCUMENTS

JP    2013182505 A    9/2013

\* cited by examiner

*Primary Examiner* — Dale E Page
*Assistant Examiner* — Quovaunda V Jefferson
(74) *Attorney, Agent, or Firm* — Holtz Holtz & Volek PC

(57) ABSTRACT

According to one embodiment, a variable resistance memory includes first and second semiconductor regions in a layer; a memory cell on the first semiconductor region, the memory cell including a first transistor having a first gate connected to a word line and a memory element, the word line extending in a first direction parallel to a surface of the layer; and a second transistor on the second semiconductor region and connected to the memory cell via a bit line, the bit line extending a second direction parallel to the surface of the layer, and the second direction intersecting the first direction. The second semiconductor region extends in a third direction parallel to the surface of the substrate and the third direction intersects the first and second directions.

17 Claims, 13 Drawing Sheets

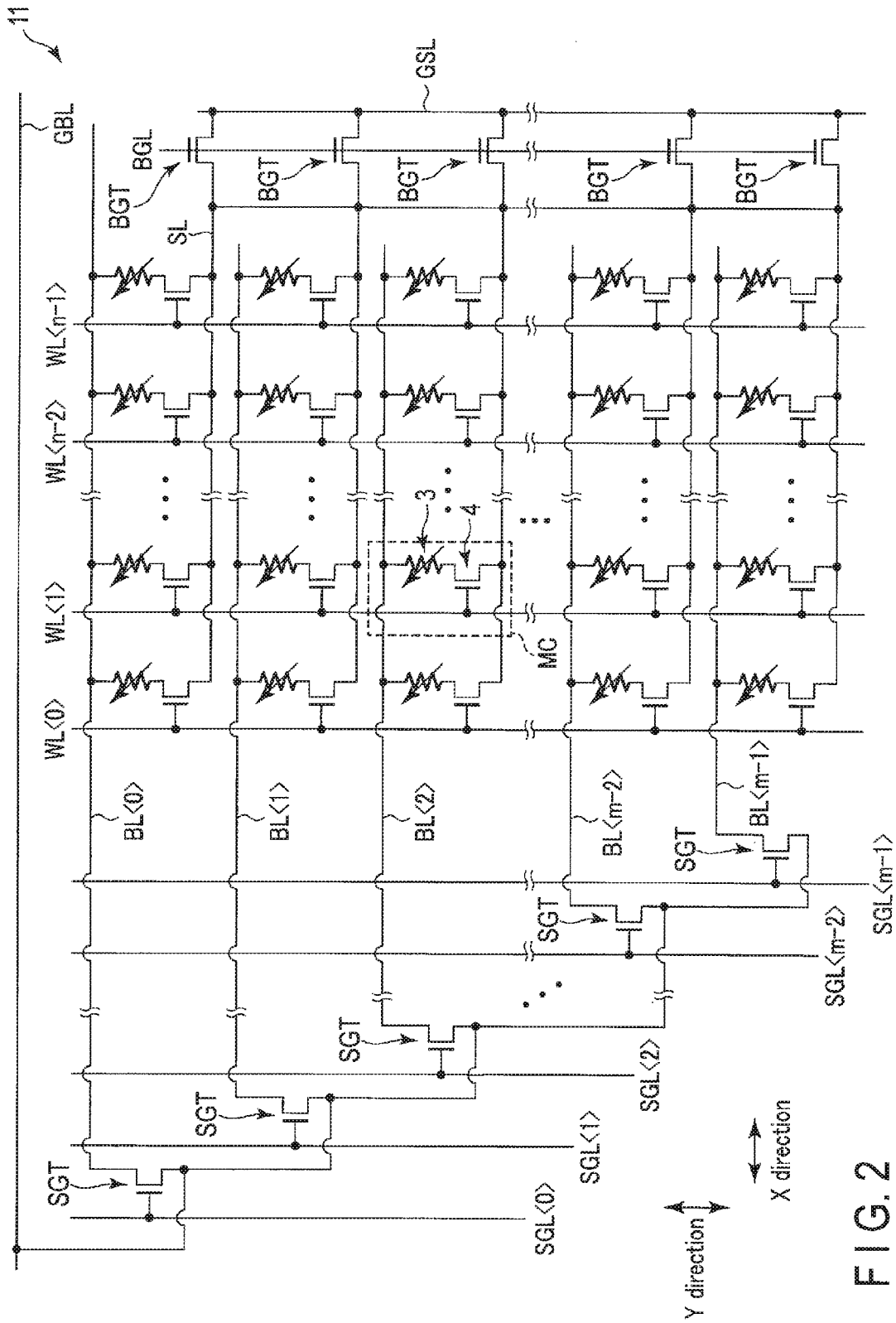
F I G. 2

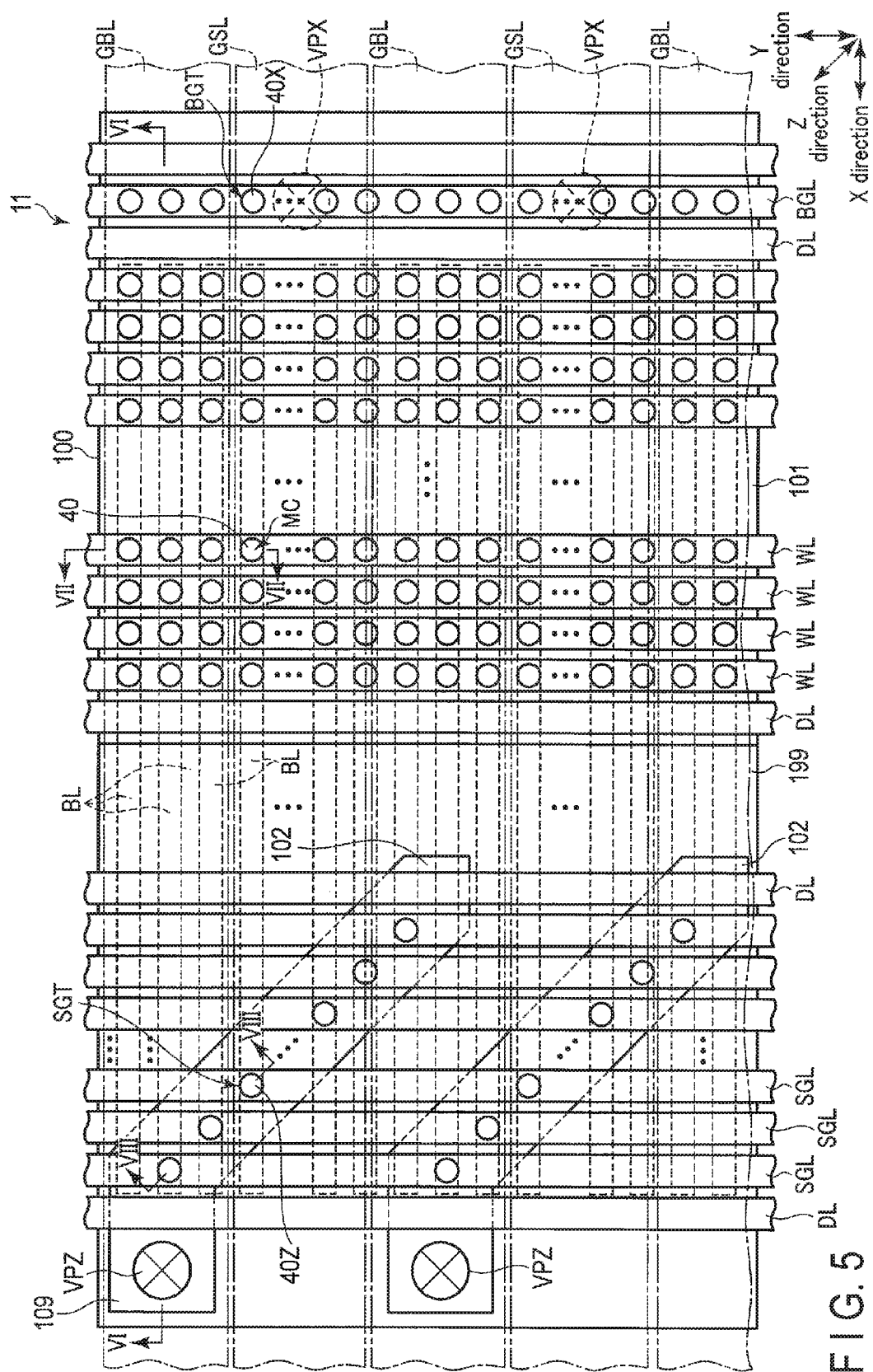
F I G. 5

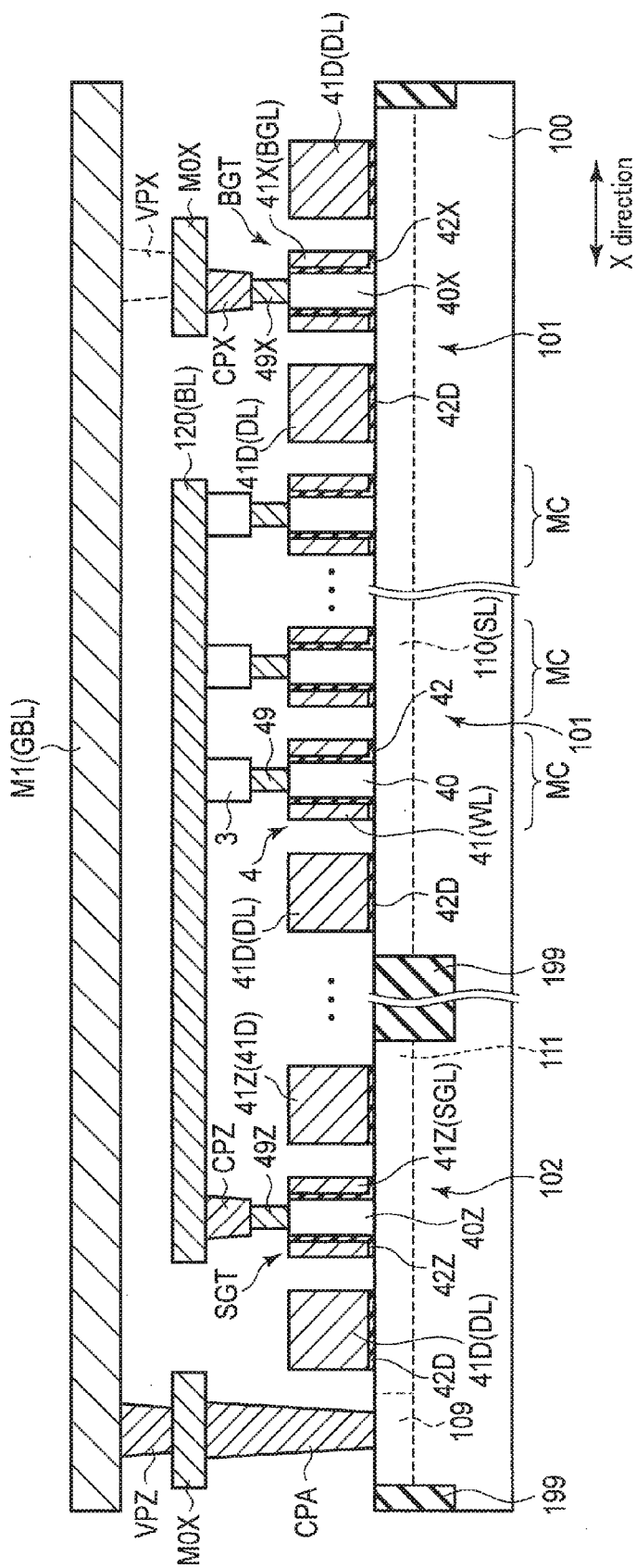
F I G. 6

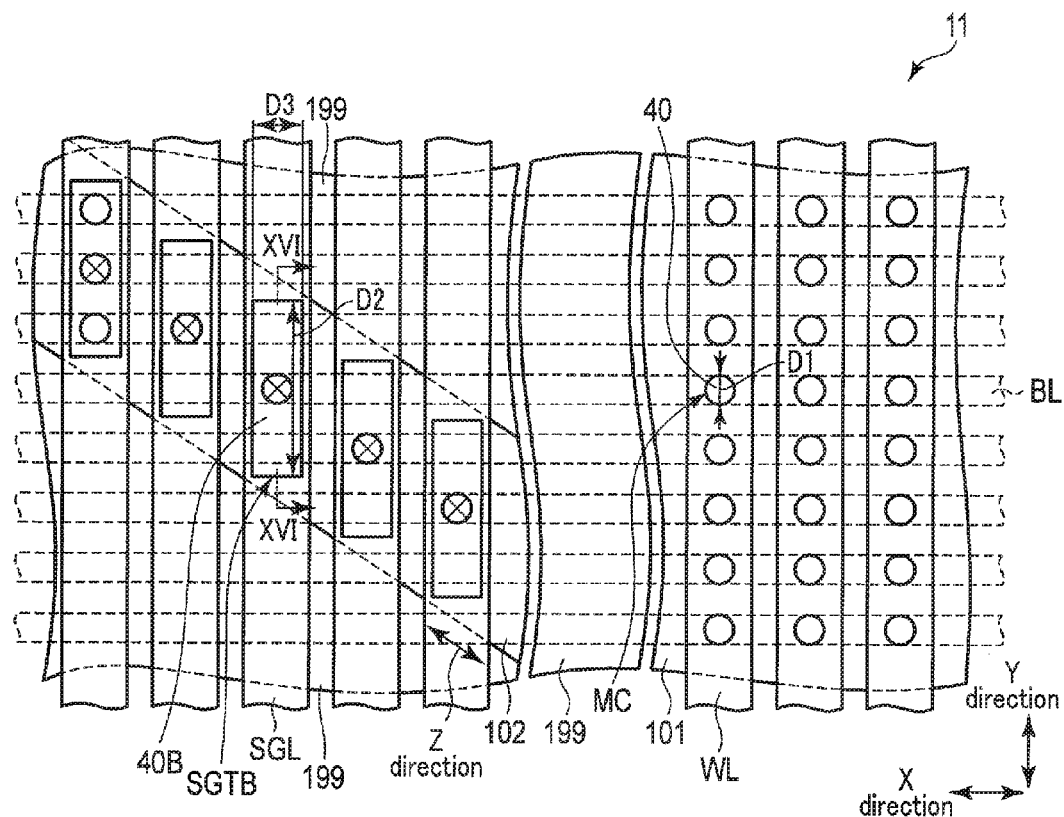
F I G. 15
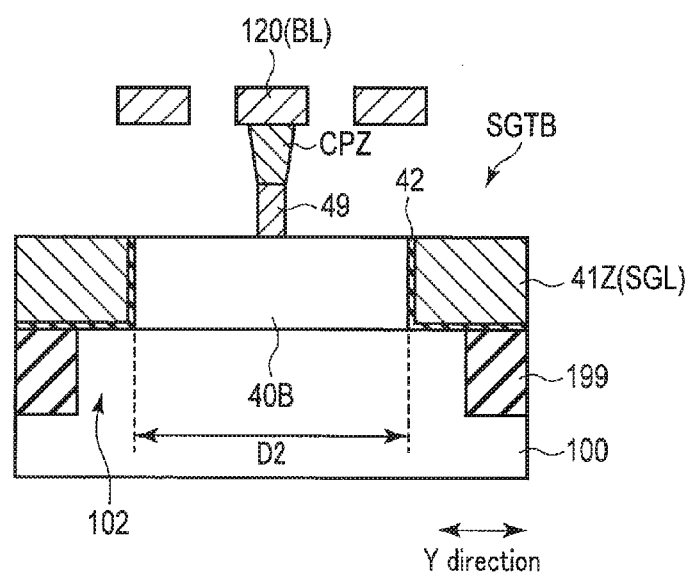
F I G. 16

VARIABLE RESISTANCE MEMORY

CROSS-REFERENCE TO RELATED APPLICATIONS

This application claims the benefit of U.S. Provisional Application No. 62/217,671, filed Sep. 11, 2015, the entire contents of which are incorporated herein by reference.

FIELD

The present embodiment relates to a variable resistance memory.

BACKGROUND

In recent years, attention is being given to the variable resistance memory as a next-generation memory device.

BRIEF DESCRIPTION OF THE DRAWINGS

FIG. 2 is an equivalent circuit diagram illustrating a configuration example of a memory cell array of the variable resistance memory according to an embodiment;

FIG. 5 is a top view showing a structure example of the memory cell array of the variable resistance memory according to a first embodiment;

FIG. 6 is a sectional view showing the structure example of the memory cell array of the variable resistance memory according to the first embodiment;

FIG. 15 is a top view showing a structure example of the memory cell array of the variable resistance memory according to a third embodiment;

FIG. 16 is a sectional view showing a structure example of the memory cell array of the variable resistance memory according to the third embodiment.

DETAILED DESCRIPTION

Figure 1:
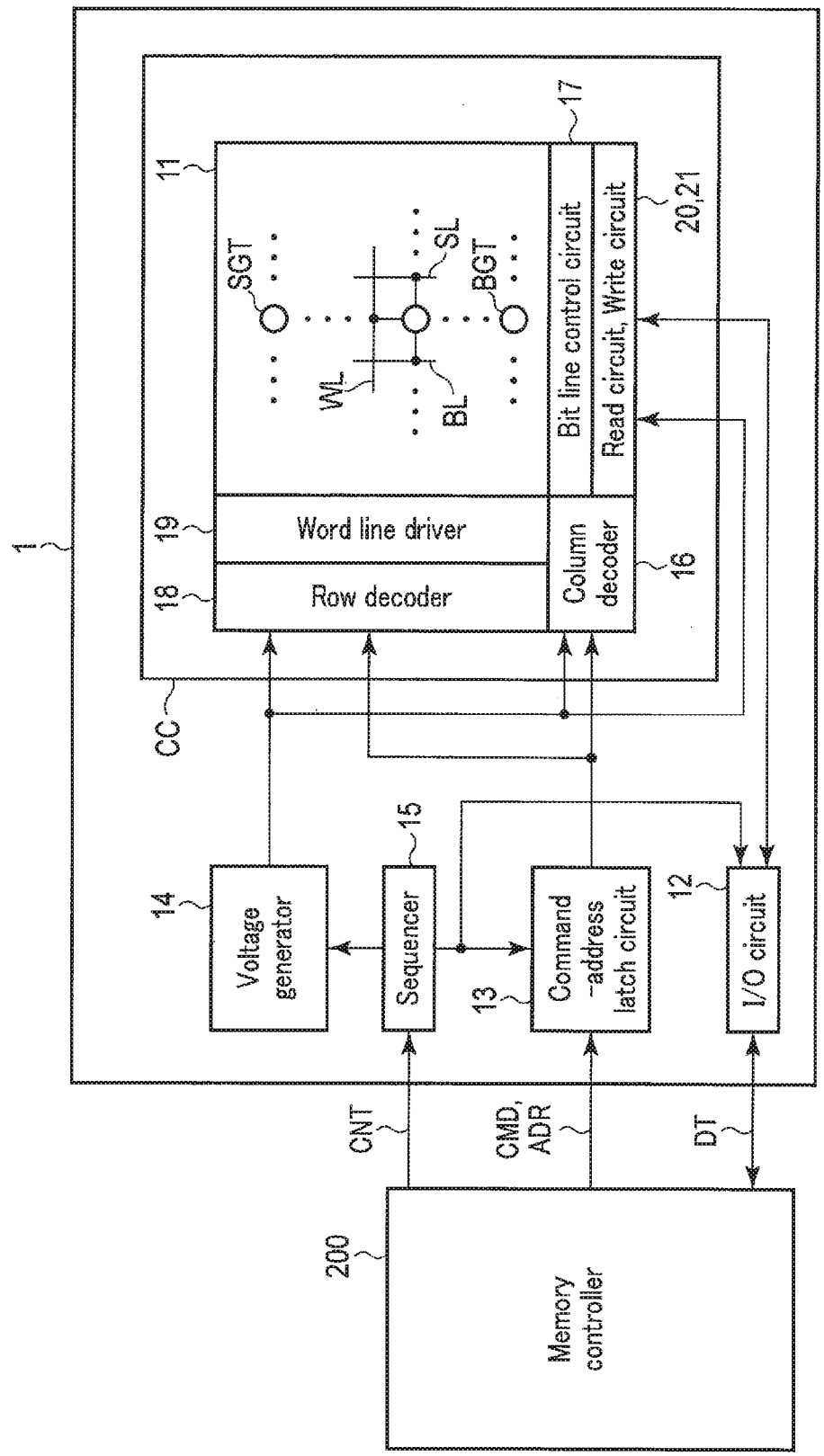
FIG. 1 is a block diagram illustrating a configuration example of a variable resistance memory according to an embodiment.

In general, according to one embodiment, a variable resistance memory includes first and second semiconductor regions arranged in a semiconductor layer a first direction parallel to a surface of the semiconductor layer, a first memory cell provided in the first semiconductor region, the first memory cell including a first transistor having a first gate connected to a word line and a first memory element on the first transistor, wherein the word line extends in a second direction parallel to the surface of the semiconductor layer, and a second transistor provided in the second semiconductor region and connected to one end of the first memory cell via a bit line extending in the first direction, wherein the second semiconductor region extends in a third direction parallel to the surface of the semiconductor layer and the third direction intersects the first and second directions.

Hereinafter, the embodiments will be described with reference to the drawings. In the description that follows, the same reference numerals are attached to components having substantially the same function and configuration and a duplicate description is provided only when necessary.

With regard to components having a letter or a number attached to the end of a reference sign, if the constituting members with different ends are not distinguished, the letter or the number at the end of the reference sign is omitted.

EMBODIMENTS

A variable resistance memory according to the embodiments will be described with reference to FIGS. 1 to 17.

(1) First Embodiment

A variable resistance memory according to the first embodiment will be described with reference to FIGS. 1 to 12.

(a) Configuration Example

A configuration example of the variable resistance memory according to the first embodiment will be described with reference to FIGS. 1 to 9.

FIG. 1 is a schematic diagram showing an outline of a memory system (storage device) including a variable resistance memory according to the present embodiment.

In the present embodiment, as shown in FIG. 1, a variable resistance memory (memory device) 1 is coupled to a memory controller (or a host device) 200. For example, the variable resistance memory 1 and the memory controller 200 are provided inside a storage device or a memory system.

The memory controller 200 requests the variable resistance memory 1 to write data or read data.

For a request to write data, the memory controller 200 sends a write command, an address where the data should be written (hereinafter, called a write address), and data to be written to the variable resistance memory 1.

For a request to read data, the memory controller 200 sends a read command and an address where the data should be read (hereinafter, called a read address) to the variable resistance memory 1. The memory controller 200 receives data read based on the read command and read address from the variable resistance memory 1. The memory controller 200 transfers the read data to another device (for example, a host device).

Based on the write command, the variable resistance memory 1 writes data from the memory controller 200 into a memory cell array 11. Based on the read command, the variable resistance memory 1 reads data from inside the memory cell array 11.

The variable resistance memory 1 includes an input/output circuit 12, a command-address latch circuit 13, a voltage generator 14, a sequencer 15, and a memory core circuit CC.

The input/output circuit 12 temporarily holds data from the memory controller 200 and also data from the memory core circuit CC.

The command-address latch circuit 13 temporarily holds a command CMD and an address ADR supplied from the memory controller 200. The command-address latch circuit 13 transfers the command CMD and the address ADR to a circuit inside the variable resistance memory 1 at a certain timing. The command-address latch circuit 13 outputs the command CMD to the sequencer 15. The command-address latch circuit 13 outputs the address ADR to the memory core circuit CC.

The voltage generator 14 generates various voltages for the operation of the variable resistance memory 1 using a power supply voltage supplied from outside.

The sequencer 15 receives a control signal CNT from the memory controller 200. The sequencer 15 controls the operation inside the variable resistance memory 1 based on the command CMD and the control signal CNT.

The memory core circuit CC includes a memory cell array 11, a column decoder 16, a bit line control circuit 17, a row decoder 18, a word line driver 19, a write circuit 20, and a read circuit 21 and the like.

The memory cell array 11 includes a plurality of memory cells MC. The memory cell MC is connected to a bit line BL, a source line (complementary bit line) SL, and a word line WL. The memory cell array 11 includes selection elements BGT, SGT to select the memory cell MC.

For example, the memory cell array 11 has a hierarchical bit line structure. Thus, the bit line BL is connected to a global bit line via the selection element SGT. The source line SL is connected to a global source line via the selection element BGT.

The column decoder 16 and the bit line control circuit 17 control a column (bit lines) of the memory cell array 11.

The column decoder 16 decodes a column address of the address ADR.

The bit line control circuit (for example, a column switch circuit) 17 selects and activates the bit line BL and a control line based on the decoded column address.

The row decoder 18 and the word line driver 19 controls a row (word lines and control lines) of the memory cell array 11.

The row decoder 18 decodes a row address of the address ADR. The row decoder 18 selects and activates the word line WL and a control line based on the decoded row address.

The word line driver 19 applies a voltage to the selected word line WL and a selected control line.

The write circuit 20 is a circuit to write data into the memory cell MC. The write circuit 20 includes a source/sink circuit to generate a write current (or a write voltage) and the like.

The read circuit 21 is a circuit to read data from the memory cell MC. The read circuit 21 includes a sense amplifier circuit and a latch circuit and the like.

FIG. 2 is an equivalent circuit diagram showing an example of an internal configuration of a memory cell array of the variable resistance memory.

In FIG. 2, the internal configuration of a portion (some control unit) inside the memory cell array is shown.

In FIG. 2, principal components of the memory cell array 11 are illustrated.

As shown in FIG. 2, a plurality of memory cells MC are arranged in a matrix shape.

A plurality of word lines WL(WL<0>, WL<1>, WL<n−2>, WL<n−1>) are provided inside the memory cell array 11. n is an integer equal to 2 or greater. The plurality of memory cells MC arranged in the Y direction are connected to a common word line WL.

A plurality of bit lines (local bit lines) BL(BL<0>, BL<1>, BL<m−2>, BL<m−1>) are provided inside the memory cell array 11. m is an integer equal to 2 or greater.

The plurality of memory cells MC arranged in the X direction in a control unit CBK are connected to a common bit line BL.

In the present embodiment, the plurality of memory cells MC arranged in the X direction and the Y direction are connected to one source line SL in a control unit CBK. Hereinafter, the source line SL connected to the plurality of memory cells MC in common will be called a common source line SL. Also hereinafter, the control unit of the plurality of memory cells corresponding to one common source line SL will be called a cell block.

One or more block gate transistors BGT are provided in the memory cell array 11. The block gate transistor (also called a source line side select transistor) BGT is an element to select the cell block CBK inside the memory cell array 11.

One end of a current path of the block gate transistor BGT is connected to the common source line SL. The other end of the current path of the block gate transistor BGT is connected to the global source line GSL.

The gate of the block gate transistor BGT is connected to a block gate line (control line) BGL.

For example, one block gate transistor BGT is provided so as to correspond to one bit line BL. One block gate transistor BGT is provided for the plurality of memory cells connected to the common bit line BL.

If, like in the present embodiment, the plurality of memory cells MC are connected to the common source line SL, gates of a plurality of block gate transistors BGT connected to one common source line SL are connected to a common block gate line BGL. In this case, when a block gate line BGL is activated, all memory cells MC connected to the common source line SL are connected to the global source line GSL via the block gate transistor BGT in an ON state.

In the present embodiment, a plurality of select gate transistors SGT are provided in the cell block BK so as to correspond to the plurality of bit lines BL in a one-to-one correspondence.

One end of the current path of the select gate transistor (also called a bit line side select gate transistor) SGT is connected to one corresponding bit line BL among the plurality of bit lines BL.

The other end of the current path of the select gate transistor SGT is connected to the global bit line GBL. The global bit line GBL is connected to the plurality of select gate transistors SGT in common.

A plurality of select gate lines SGL(SGL<0>, SGL<1>, SGL<2>, SGL<m−2>, SGL<m−1>) are provided in the cell block CBK.

The gate of the select gate transistor SGT is connected to one corresponding select gate line SGL among the plurality of select gate lines SGL.

The one selected select gate transistor SGT selectively connects electrically one bit line BL corresponding to the select gate transistor SGT among the plurality of bit lines BL to the global bit line GBL.

For example, one global bit line GBL corresponds to one control unit (called a segment in the present embodiment) for the column of the memory cell array 11. For example, 16 bit lines BL are allocated to one global bit line GBL in one cell block CBK. In this case, 16 select gate lines SGL and 16 select gate transistors SGT are allocated to one global bit line GBL in one cell block CBK.

The memory cell MC includes one memory element 3 and one selection element 4. In a variable resistance memory according to the present embodiment, the memory element 3 is a variable resistance element. The selection element 4 is a field effect transistor (hereinafter, called a cell transistor).

A structure example of the memory cell of a variable resistance memory according to the present embodiment will be described using FIGS. 3 and 4.

Figure 3:
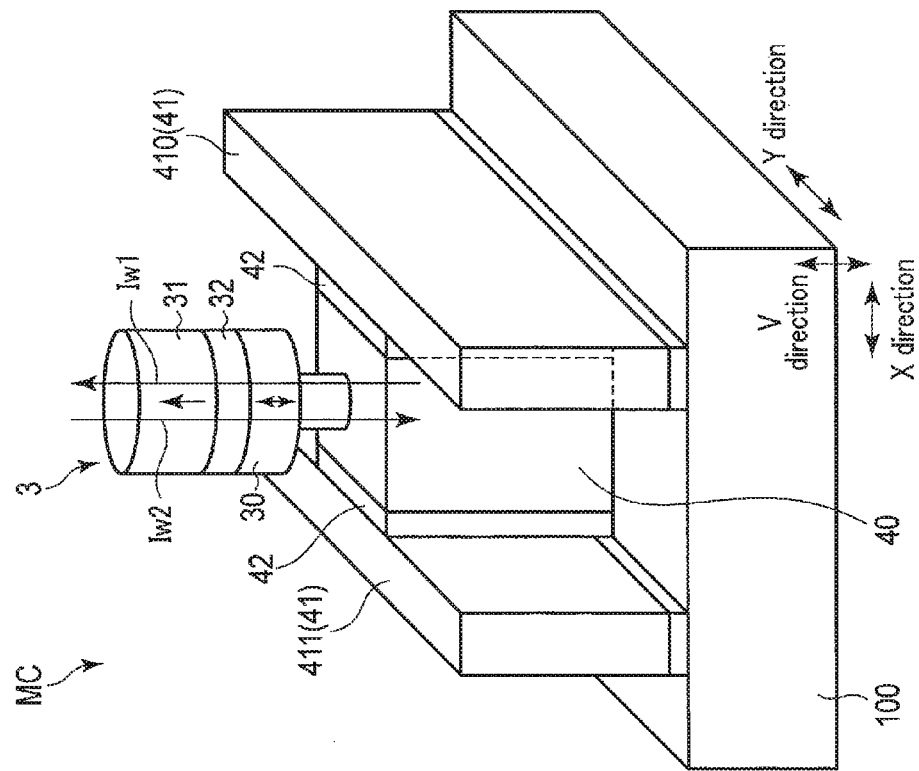
FIG. 3 is a bird's eye view showing a configuration example of the memory cell of the variable resistance memory according to an embodiment.

FIG. 3 is a bird's eye view illustrating a structure example of the memory cell of the variable resistance memory according to the present embodiment.

As shown in FIG. 3, the cell transistor 4 is provided on a semiconductor substrate 100. For example, the cell transistor 4 is a vertical type transistor.

The current path of the vertical type transistor 4 is parallel to a direction (V direction) perpendicular to the surface of the semiconductor substrate 100. Here, perpendicular means being perpendicular or approximately perpendicular to the surface of the semiconductor substrate 100. Approximately perpendicular means that a certain angle is within the range of $40°\leq\theta\leq 90°$ with respect to the surface of the semiconductor substrate 100.

One terminal of the vertical type transistor 4 is positioned on the side of the memory element 3 and the other terminal is positioned on the side of the substrate 100. In this manner, two terminals as a source/drain of the vertical type transistor 4 are arranged in the direction perpendicular to the surface of the semiconductor substrate 100.

The vertical type transistor 4 as a cell transistor includes a semiconductor portion 40, a gate electrode 41, and a gate insulating film 42.

The semiconductor portion (body portion) 40 extends in the V direction. For example, the semiconductor portion 40 has a prismatic shape. The semiconductor portion 40 is joined to the semiconductor substrate 100. One terminal of the source/drain is provided inside one end (top end) of the semiconductor portion 40 in the V direction and the other terminal of the source/drain is provided inside the other end (bottom end) of the semiconductor portion 40 in the V direction. The semiconductor portion 40 functions as a channel portion (channel region) of the vertical type transistor 4.

The gate electrode 41 is opposed to the side face of the semiconductor portion 40. The gate insulating film 42 is provided between the side face of the semiconductor portion 40 and the gate electrode 41. The side face of the semiconductor portion 40 is a surface intersecting the direction parallel to the surface of the semiconductor substrate 100.

If the vertical type transistor 4 has, like the example shown in FIG. 3, a double gate structure, the gate electrode 41 includes two electrode portions 410, 411. The two electrode portions 410, 411 are opposite to each other across the semiconductor portion 40 in a direction (for example, the X direction) parallel to the surface of the semiconductor substrate 100. The electrode portion 410 is provided on the gate insulating film 42 covering the side face on one side in the X direction of the semiconductor portion 40 and the electrode portion 411 is provided on the gate insulating film 42 covering the side face on the other side in the X direction of the semiconductor portion 40.

A source line is arranged inside the semiconductor substrate 100 below the vertical type transistor 4.

The memory element 3 is arranged above one terminal of the vertical type transistor (cell transistor) 4. The bit line BL is arranged above the memory element 3.

Thus, the cell size of the memory cell MC is reduced by the memory element 3 being stacked on the cell transistor 4 in the direction perpendicular to the surface of the semiconductor substrate.

In addition, cutoff characteristics of the memory cell MC are improved and also supply characteristics of a current to the memory element 3 are improved by a vertical type transistor being used as the cell transistor 4.

In the present embodiment, the variable resistance memory 1 is a magnetic memory (for example, a magnetic random access memory). The magnetic memory includes a magnetoresistive effect element as the memory element (variable resistance element) 3.

If the memory element 3 is a magnetoresistive effect element, the magnetoresistive effect element 3 is an element including a magnetic tunnel junction (hereinafter, called a MTJ element).

The MTJ element 3 as a memory element includes at least a storage layer 30, a reference layer 31, and a tunnel barrier layer 32. The tunnel barrier layer (for example, a film including MgO) 32 is provided between the storage layer 30 and the reference layer 31.

The storage layer 30 is a magnetic layer in which the orientation of magnetization is variable. The reference layer 31 is a magnetic layer in which the orientation of magnetization is invariable. The storage layer 30 and the reference layer 31 are a magnetic layer (for example, a film including CoFeB) having vertical magnetic anisotropy. That the orientation of magnetization is variable indicates that the orientation of magnetization is changed by a predetermined write current. That the orientation of magnetization is invariable indicates that the orientation of magnetization is not changed by a predetermined write current.

The resistance value of the MTJ element 3 changes in accordance with the relative relationship between the orientation of magnetization of the reference layer 31 and the orientation of magnetization of the storage layer 30. If the orientation of magnetization of the storage layer 30 is the same as the orientation of magnetization of the reference layer 31, the MTJ element 3 has a first resistance value R1. If the orientation of magnetization of the storage layer 30 is different from the orientation of magnetization of the reference layer 31, the MTJ element 3 has a second resistance value R2 higher than the first resistance value R1.

First data (for example, "0" data) is associated with the MTJ element 3 in a state having the first resistance value R1 (first resistance state). Second data (for example, "1" data) is associated with the MTJ element 3 in a state having the second resistance value (second resistance state).

Thus, the resistance value of the MTJ element 3 is changed by a magnetization array state of the MTJ element 3 being controlled, allowing the MTJ element 3 to function as a memory element.

For example, the resistance state (magnetization array state) of the MTJ element 3 as a memory element is controlled by spin-transfer torque (STT).

When data is written into the MTJ element 3, currents (hereinafter, called write currents) Iw1, Iw2 are passed to the MTJ element 3 to change the orientation of magnetization of the storage layer 30. Current values of the write currents Iw1, Iw2 are equal to the magnetization reversal threshold or more of the storage layer 30 and less than the magnetization reversal threshold of the reference layer 31. The magnetization reversal threshold is a current value to reverse the magnetization of a magnetic layer.

When the write current Iw (Iw1, Iw2) is supplied to the MTJ element 3 in the memory cell selected to write data, the cell transistor 4 is turned on.

In an STT type magnetic memory, the orientation of magnetization of the storage layer 30 changes in accordance with the direction of the write current Iw flowing through the MTJ element 3.

If the orientation of magnetization of the storage layer 30 is set to the same state as that of the reference layer 31 (parallel magnetization state), the write circuit 20 passes the write current Iw1 in the direction from the storage layer 30 to the reference layer 31.

Due to the write current Iw1, spin torque resulting from spin in the same orientation as that of the magnetization of the reference layer 31 acts on the magnetization of the storage layer 30. Accordingly, the orientation of magnetization of the storage layer 30 is aligned with the orientation of magnetization of the reference layer 31. Therefore, the resistance value of the MTJ element 3 becomes the first resistance value R1 and the MTJ element 3 holds the first data.

On the other hand, if the orientation of magnetization of the storage layer 30 is set to an opposite state to that of the reference layer 31 (anti-parallel magnetization state), the write circuit 20 passes the write current Iw2 in the direction from the reference layer 31 to the storage layer 30.

Due to the write current Iw2, spin torque resulting from spin in the orientation opposite to that of the magnetization of the reference layer 31 acts on the magnetization of the storage layer 30. Accordingly, the orientation of magnetization of the storage layer 30 is opposite to the orientation of magnetization of the reference layer 31. Therefore, the resistance value of the MTJ element 3 becomes the second resistance value R2 and the MTJ element 3 holds the second data.

Thus, in the present embodiment, when the current Iw1 from the source line SL toward the bit line BL is supplied into the MTJ element 3, "0" data is written into the memory cell MC. When the current Iw2 from the bit line BL toward the source line SL is supplied into the MTJ element 3, "1" data is written into the memory cell MC.

Figure 4:
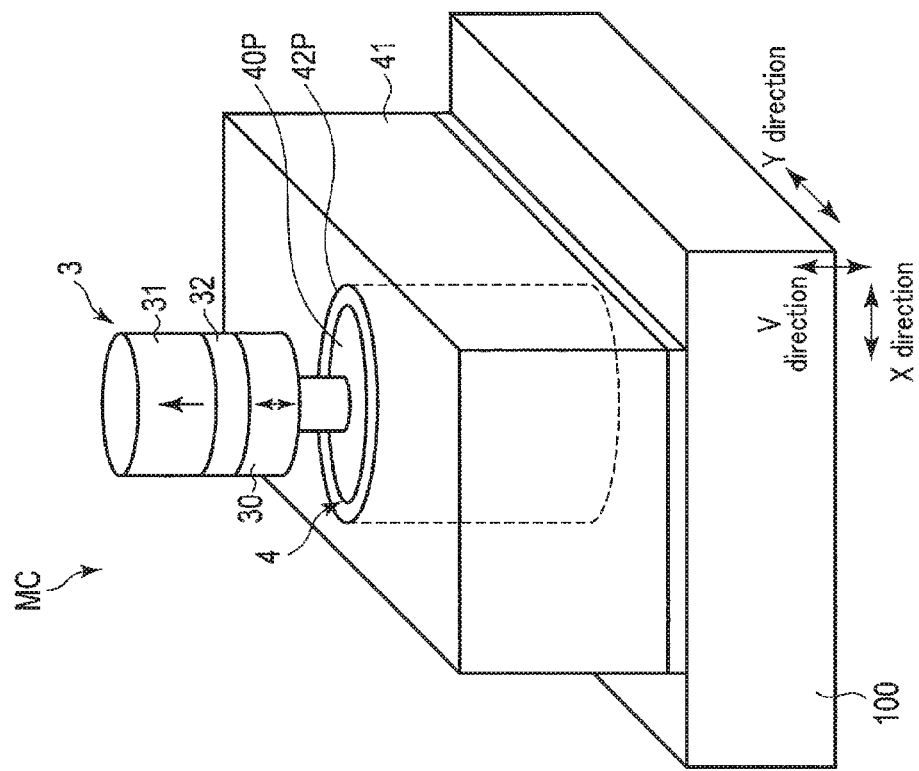
FIG. 4 is a bird's eye view showing a configuration example of the memory cell of the variable resistance memory according to an embodiment.

FIG. 4 is a bird's eye view illustrating a modification of the memory cell of the variable resistance memory according to the present embodiment.

As shown in FIG. 4, a vertical type transistor in a surrounding gate structure may also be used as the cell transistor 4.

In the vertical type transistor 4 in a surrounding gate structure, the entire side face of the semiconductor portion 40 is covered with the gate electrode 41 via a gate insulating film 42P.

In the cell transistor 4 in a surrounding gate structure, for example, a semiconductor portion 40P has a columnar structure. However, the semiconductor portions 40, 40P of the cell transistor 4 do not depend on the gate structure and may be prismatic or columnar. The sectional shape of the semiconductor portions 40, 40P may be trapezoidal.

Depending on the internal configuration of the memory cell array 11, the reference layer 31 may be arranged on the side of the cell transistor 4 and the storage layer 30 may be arranged on the side of the bit line.

(b) Structure Example of the Memory Cell Array

A structure example of the variable resistance memory according to the present embodiment will be described with reference to FIGS. 5 to 9.

Figure 7:
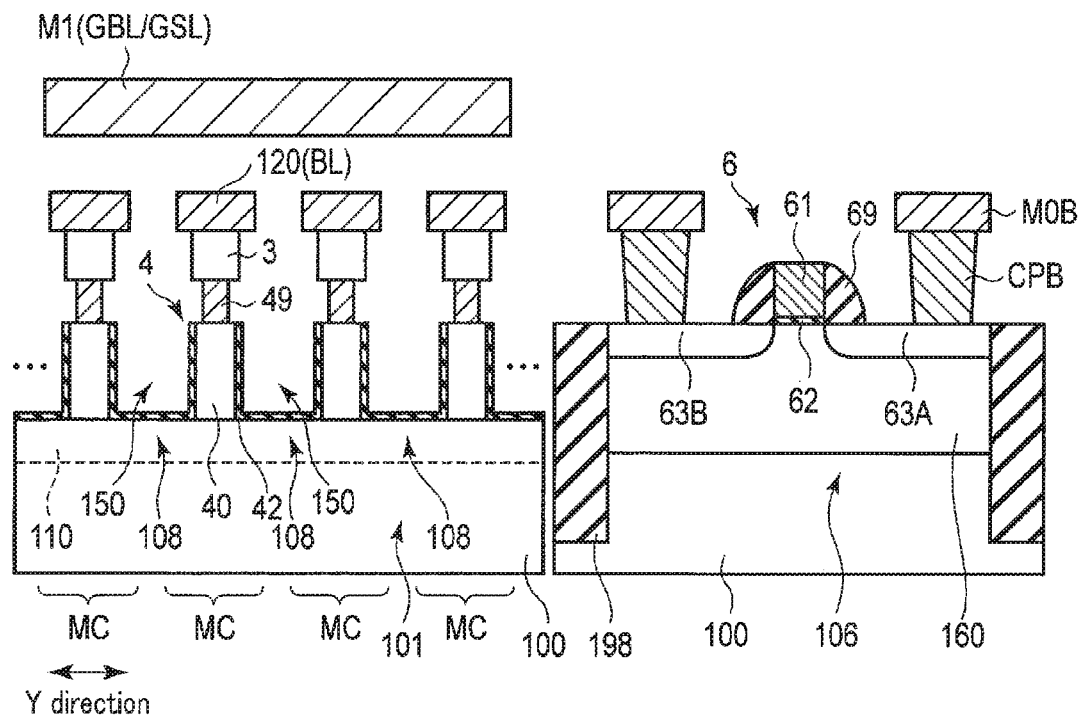
FIG. 7 is a sectional view showing the structure example of the memory cell array of the variable resistance memory according to the first embodiment.
Figure 8:
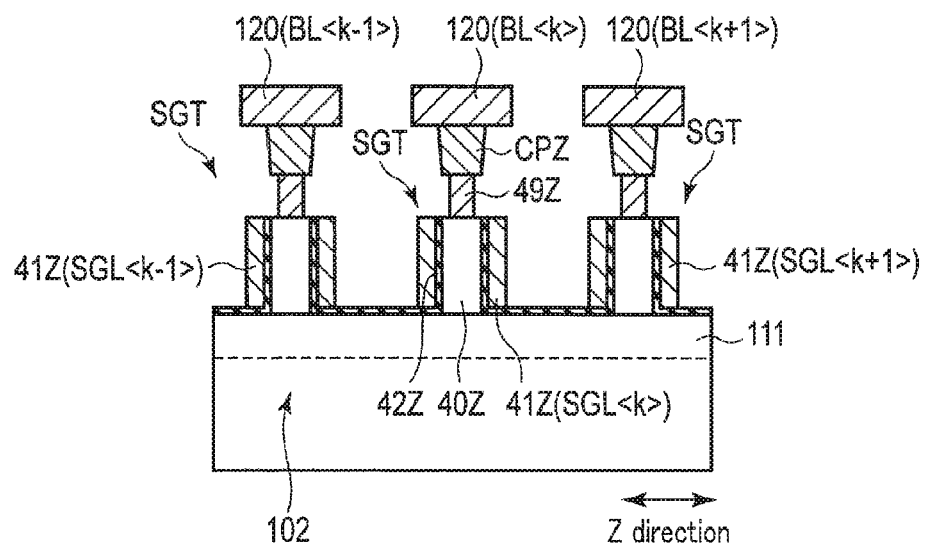
FIG. 8 is a sectional view showing the structure example of the memory cell array of the variable resistance memory according to the first embodiment.

FIG. 5 is a top view showing a planar structure of the memory cell array of the variable resistance memory according to the present embodiment. FIGS. 6 to 8 are sectional views showing a sectional structure of the memory cell array of the variable resistance memory according to the present embodiment. FIG. 6 corresponds to a cross section along a VI-VI line in FIG. 5. FIG. 7 corresponds to a cross section along a VII-VII line in FIG. 5. FIG. 8 corresponds to a cross section along a VIII-VIII line in FIG. 5. In FIGS. 6 to 8, the illustration of an interlayer insulating film on the semiconductor substrate is omitted to clarify and simplify the illustration.

As shown in FIGS. 5 to 7, the plurality of memory cells MC are provided in a semiconductor region 101 in the semiconductor substrate (for example, a silicon single crystal substrate) 100 in the memory cell array 11. Hereinafter, the semiconductor region 101 where a plurality of memory cells are provided will be called the cell block region 101. The cell block region 101 is a rectangular (flat) semiconductor region.

The plurality of memory cells MC are arranged in the cell block region 101 in a matrix shape.

A plurality of word lines WL extend in the Y direction on the cell block region 101. The plurality of word lines WL are arranged in the X direction with predetermined pitches.

The word line WL is a conductive layer including at least one of a silicide layer, a metal layer, a semiconductor layer, and a compound layer.

The conductive layer 41 as a word line is opposed to the side face of the semiconductor portion 40 of the cell transistor 4 via the gate insulating film 42. The conductive layer 41 is used as the word line WL and also used as the gate electrode 41 of the cell transistor 4.

The insulating film 42 is provided between the top surface of the semiconductor region 101 and the bottom of the conductive layer 41. The insulating film is a film formed simultaneously with the gate insulating film 42.

Short-circuits between the conductive layer 41 and the semiconductor region 101 are prevented by the insulating film. The insulating film between the conductive layer 41 and the semiconductor region 101 may also be formed separately from the process of the gate insulating film 42.

The semiconductor portion 40 is a semiconductor region continuing from the semiconductor substrate 100. For example, the semiconductor portion 40 is a semiconductor region cut out from the semiconductor substrate 100 by photolithography and etching of the semiconductor substrate 100. In this case, the semiconductor portion 40 continues to the semiconductor substrate 100.

Incidentally, the semiconductor portion 40 may be a film (crystalline layer) formed on the semiconductor substrate 100 by film deposition technology or crystal growth technology. In this case, the semiconductor portion 40 does not continue to the semiconductor substrate 100. However, even if the semiconductor portion 40 and the semiconductor substrate 100 are made of different members, a current flows between the semiconductor portion 40 and the semiconductor substrate 100.

The cell block region 110 is a region (flat semiconductor region) continuing in the X direction and the Y direction. Thus, as shown in FIG. 7, regions where memory cells (cell transistors) adjacent in the Y direction are provided are mutually connected by the semiconductor region 108 without being isolated by an insulating film. Accordingly, a plurality of the semiconductor portions 40 arranged in the Y direction are mutually electrically connected.

A neighborhood region (surface layer of the semiconductor region) 110 of a junction of the semiconductor portion 40 and the semiconductor region 101 functions as the common source line SL. For example, the layer (hereinafter, called a common source line layer) 110 is a semiconductor region (diffusion layer) including impurities. With the addition of impurities, the common source line layer 110 has a lower resistance value than a region of the semiconductor substrate 100 including no impurities.

In FIG. 7, if the cell transistor 4 is, for example, a vertical type transistor in a double gate structure, an insulating film (not shown) is provided in a region 150 between the semiconductor portions 40 adjacent in the Y direction. If the cell transistor 4 is a vertical type transistor in a surrounding gate structure, by contrast, a conductive layer (word line) is provided in the region 150.

A plug 49 is provided on the top end of the semiconductor portion 40. The memory element (for example, an MTJ element) 3 is provided on the plug 49.

For example, the block gate transistor BGT is provided, as shown in FIGS. 5 and 6, in the cell block region 101. The semiconductor region where the block gate transistor BGT is provided (hereinafter, may also be called a block gate region) continues to a region where the memory cell MC is provided.

The block gate region is positioned on the one end side in the X direction of the cell block region 101.

The block gate transistor BGT is a vertical type transistor. The block gate transistor BGT has substantially the same structure as the cell transistor 4. The block gate transistor BGT is formed simultaneously in a process common to the cell transistor 4.

The block gate transistor BGT includes a semiconductor portion 40X, a gate electrode 41X, and a gate insulating film 42X.

The conductive layer as the gate electrode 41X is opposed to the side face of the semiconductor portion 40X via the gate insulating film 42X. The insulating film 42X is provided between the gate electrode 41X and the top surface of the semiconductor substrate 100. The gate electrode (conductive layer) 41X extends in the Y direction and is shared by the plurality of block gate transistors BGT arranged in the Y direction. The gate electrode 41X functions as the block gate line BGL.

The bottom end of the semiconductor portion 40X is connected to the semiconductor region 101 (semiconductor substrate 100) as a cell block region. Accordingly, one end of the block gate transistor BGT is connected to the common source line 110. The block gate transistors BGT connected to the same common source line 110 share the gate electrode 41X.

Plugs 49X, CPX are stacked on the top end of the semiconductor portion 40X. An intermediate interconnect (metal film) MOX is provided on the plug CPX. The intermediate interconnect MOX is connected to the global source line GSL via a via plug VPX. Accordingly, the other end of the block gate transistor BGT is connected to the global source line GSL.

The select gate transistor SGT is provided, as shown in FIGS. 5 to 8, in a semiconductor region (hereinafter, called a select gate region) 102 isolated from the cell block region 101.

The select gate region 102 is arranged side by side with the cell block 101 on the other end side in the X direction of the cell block region 101 in the memory cell array 11. For example, an isolation insulating film (isolation region) 199 including a silicon oxide film is provided in a trench between the select gate region 102 and the cell block region 101.

The semiconductor region as the select gate region 102 is electrically isolated from the cell block region 101 by the isolation insulating film 199.

A plurality of select gate regions 102 are provided in the memory cell array 11. The plurality of select gate regions 102 are arranged in the Y direction. One select gate region 102 is connected to one global bit line GBL.

The plurality of select gate transistors SGT are provided in each of the select gate regions 102.

The select gate transistor SGT is a vertical type transistor. The select gate transistor SGT has substantially the same structure as the cell transistor 4. The select gate transistor SGT is formed simultaneously in a process common to the cell transistor 4.

The select gate transistor SGT includes a semiconductor portion 40Z, a gate electrode 41Z, and a gate insulating film 42Z. The gate electrode 41Z is opposed to the side face of the semiconductor portion 40Z. The gate insulating film 42Z is provided between the semiconductor portion 40Z and the gate electrode 41Z. The gate electrode 41Z extends in the Y direction and functions as the select gate line SGL. For example, the select gate line SGL is across over the plurality of select gate regions 102 arranged in the Y direction via the isolation region 199. Accordingly, the plurality of select gate transistors SGT arranged on the same straight line (Y direction) among the plurality of select gate transistors SGT in the different select gate regions 102 are connected to the common select gate line SGL.

Two plugs 49Z, CPZ are stacked on the top end of the semiconductor portion 40Z.

The bit line BL is provided on the plug CPZ of the select gate transistor SGT.

The plurality of bit lines (local bit lines) BL extend in the X direction above the semiconductor substrate 100 such as to be across the select gate region 102, the isolation region 199, and the cell block region 101. The plurality of bit lines BL are arranged with predetermined interconnect pitches in the Y direction.

The bit line BL is a metal film 120 provided in an interlayer insulating film (not shown) covering the surface of the semiconductor substrate 100. The metal film 120 as the bit line BL is provided above the plurality of memory elements 4 and select gate transistors SGT arranged in the X direction.

The current path of the select gate transistor SGT and the current path of the memory cell MC are connected by the bit line BL.

Incidentally, an electric conductor (a plug or an electrode) may be provided between the memory element 3 and the bit line BL. Instead of the plugs CPX, CPZ, an MTJ element in which an electrical breakdown of a tunnel barrier layer is caused and/or a structure in which a conductive layer, instead of the tunnel barrier layer, is sandwiched between magnetic layers may be provided on the top end of the semiconductor portions 40X, 40Z.

The bottom end of the semiconductor portion 40Z is connected to the semiconductor region 102. The bottom end of the semiconductor portion 40Z is connected to the global bit line GBL via the semiconductor region 102. To reduce the resistance of the current path that connects the semiconductor portion 40Z to the global bit line GBL, an impurity region (diffusion layer) 111 may be provided in a surface layer of the semiconductor region 102.

The global bit line GBL and the global source line GSL are positioned at the same interconnect level (height from the substrate surface) and extend in parallel along the X direction. For example, the global source line GSL is arranged between the two global bit lines GBL in the Y direction.

As described above, the global source line GSL is connected to the top end of the semiconductor portion 40X of the block gate transistor BGT via the plugs 49X, CPX, VPX and the intermediate interconnect MOX.

The global bit line GBL is connected to a plug CPA on a fringe 109 in the select gate region 102 via the intermediate interconnect (metal film) MOX and a via plug VPZ. The fringe (contact region) 109 is a semiconductor region continuing to the select gate region 102. For example, each of the select gate regions 102 arranged in the Y direction is connected to a different global bit line GBL. In accordance with storage capacities or the design (layout) of a variable resistance memory, a plurality of select gate regions (not shown) arranged in the X direction may be provided. In this case, the plurality of select gate regions arranged in the X direction may be connected to the common global bit line GBL.

As shown in, for example, FIG. 7, elements of peripheral circuits such as a row/column decoder and a bit line control circuit and the like are provided inside the semiconductor substrate 100 common to the cell block region 101.

For example, the semiconductor substrate 100 includes a semiconductor region (hereinafter, called a peripheral circuit region) 106 where peripheral circuits are provided. An isolation insulating film 198 is provided between the peripheral circuit region 106 and the cell block region 101.

A plurality of elements (for example, field effect transistors) 6 are provided in the semiconductor region 106. In FIG. 7, for simplification of illustration, only one field effect transistor is illustrated.

The field effect transistor 6 is a transistor in a planar structure.

The field effect transistor 6 is provided in a well region 160 in the peripheral circuit region 106. A gate insulating film 62 is provided on the surface of the well region 160. A gate electrode 61 is provided on the gate insulating film 62. Two source/drain regions (diffusion layers) 63A, 63B are provided in the well region 160 such as to sandwich a channel region below the gate insulating film 62. An interconnect MOB is connected to a contact plug CPB on the source/drain regions (diffusion layers) 63A, 63B. For example, the contact plug CPB is formed simultaneously with the plugs CPX, CPZ.

The current path of the transistor 6 in a planar structure is parallel to the surface of the semiconductor substrate 100.

For example, regarding the position of a member in a direction perpendicular to the surface of the semiconductor substrate 100 (height from the bottom of the semiconductor substrate), the position of the surface of the well region 160 is substantially the same as the position of the top end of the semiconductor portion 40.

To make interconnect capacities arising in, for example, the word line WL, the select gate line SGL, and the block gate line BGL uniform, a dummy interconnect DL (41D) may be provided in the cell block region 101 and the select gate region 102. The dummy interconnect 41D is formed simultaneously with the gate electrodes 41, 41X, 41Z of the vertical type transistors 4, BGT, SGT respectively.

An insulating film 42D is provided between the bottom face of the dummy interconnect 41D and the semiconductor regions 101, 102. The insulating film 42D is formed simultaneously with the gate insulating films 42, 42X, 42Z of the vertical type transistors 4, BGT, SGT respectively. Incidentally, a voltage may be applied to the dummy interconnect 41D to mitigate the influence of interconnect capacities. The dummy interconnect 41D may be set to a floating state.

The dummy interconnect 41D may not be provided in a memory cell array.

In the present embodiment, the select gate region 102 extends in a third direction (Z direction) parallel to the substrate surface. The Z direction is a direction intersecting the X direction and the Y direction. The select gate region 102 extends in an oblique direction along a surface (X-Y plane) parallel to the surface of the semiconductor substrate 100.

In the present embodiment, the plurality of select gate transistors SGT in the select gate region 102 are arranged along the extending direction (Z direction, oblique direction) of the select gate region 102.

As shown in FIGS. 5 and 8, regarding a plurality of select gate lines and select gate transistors in the common select gate region 102, for example, the select gate transistor SGT<k> connected to the k-th select gate line SGL<k> is arranged between the (k−1)-th select gate line (conductive layer) SGL<k−1> and the (k+1)-th select gate line SGL<k+1> in the X direction. k is an integer equal to (m−2) or less.

In the one select gate region 102, the semiconductor portion 40Z of the select gate transistor SGT<k> is not adjacent to the semiconductor portion 40Z of the other select gate transistors SGT<k+1>, SGT<k−1> in the X direction. In the one select gate region 102, the semiconductor portion 40Z of the select gate transistor SGT is not adjacent to the semiconductor portion 40Z of other select gate transistors in the Y direction.

In the plurality of select gate transistors SGT in the one select gate region 102, a plurality of the semiconductor portions 40Z are connected to the common semiconductor region (semiconductor substrate) 102. For example, the other ends of the current paths of the plurality of select gate transistors SGT are connected to each other by the semiconductor region 102. The other ends of the current paths of the plurality of select gate transistors SGT in the one semiconductor region 102 are connected to the common plug CPA via the semiconductor region 102.

Each of the select gate transistors SGT in the common select gate region is electrically isolated from each other by the select gate transistor SGT being turned off.

Figure 9:
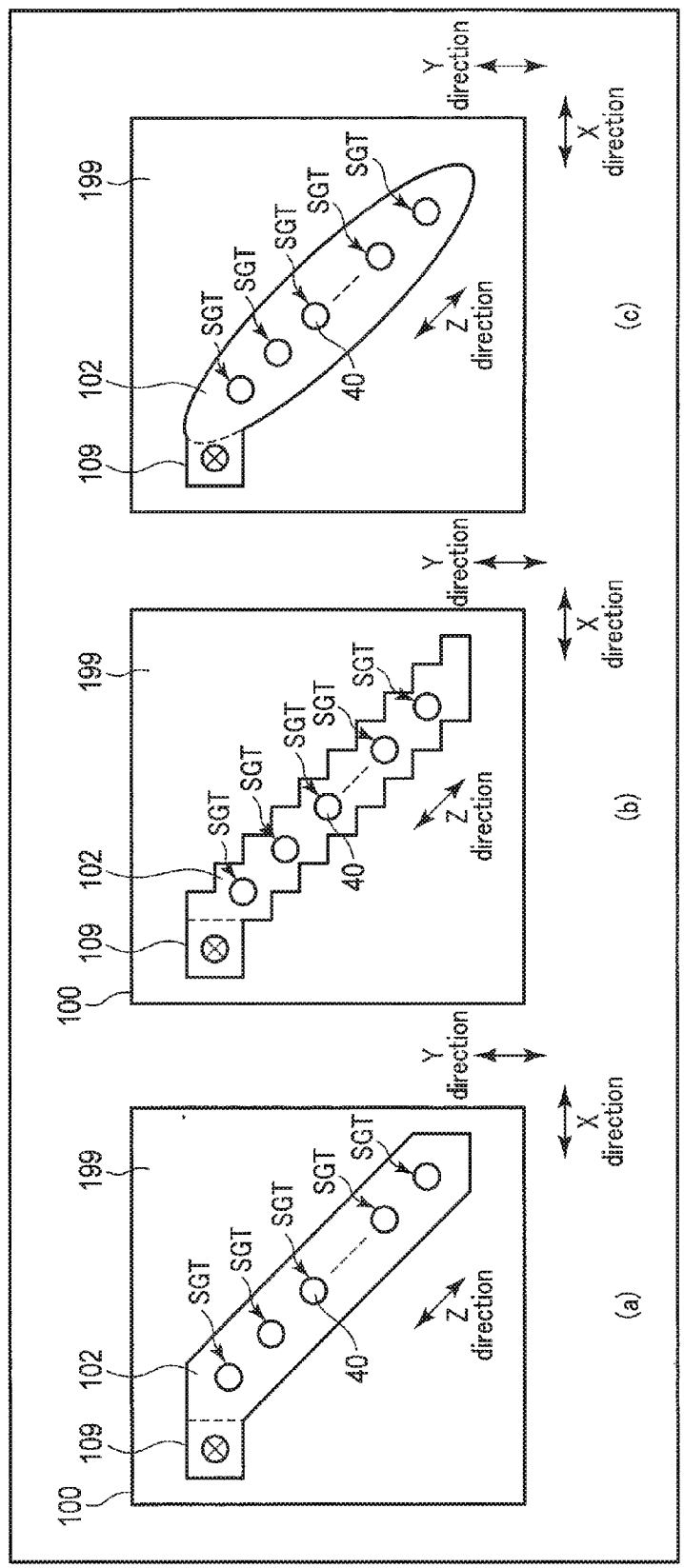
FIG. 9 is top view showing the structure example of the memory cell array of the variable resistance memory according to the first embodiment.

FIG. 9 is a schematic top view extracting and showing a select gate region inside a semiconductor substrate in the variable resistance memory according to the present embodiment.

As shown in (a) of FIG. 9, the select gate region 102 is surrounded by the device isolation region (isolation insulating film) 199. The select gate region 102 has a rectangular plane shape.

In the example of (a) of FIG. 9, the select gate region (semiconductor region) 102 in a hexagonal shape is shown, but as long as the shape allows the semiconductor region 102 to extend in the Z direction, the plane shape of the select gate region 102 may be quadrangular (rectangular). In (a) of FIG. 9, the select gate region 102 may have a shape in which an edge in the extending direction of the select gate region 102 is rounded.

The fringe 109 is provided at an edge of the select gate region 102. The contact plug CPA is provided on the fringe 109.

As shown in (b) of FIG. 9, a select gate region 102A may have a plane shape extending stepwise.

Also, as shown in (c) of FIG. 9, a select gate region 102B may have an elliptic plane shape. The select gate region 102 may have a plane shape having a curve in a certain portion of the semiconductor region.

The longitude direction of the select gate region 102 (102A, 102B) is along the Z direction.

In a variable resistance memory according to the present embodiment, as described above, a plurality of select gate transistors SGT are arranged along an extending direction of the semiconductor region 102 in the semiconductor region 102 extending in an oblique direction with respect to the X direction and the Y direction parallel to the substrate surface.

Accordingly, in a variable resistance memory according to the present embodiment, the select gate transistors SGT that are independently controlled can be arranged in the memory cell array 11 without forming the fine device isolation region 199, without using complex manufacturing processes, and without arranging a large exclusive area semiconductor region.

Therefore, a variable resistance memory according to the present embodiment can achieve high integration of constituting elements in a memory cell array.

(c) Operation Examples

Operation examples of the variable resistance memory according to the present embodiment will be described with reference to FIGS. 10 to 12.

<Write Operation>

A write operation of the variable resistance memory according to the present embodiment will be described with reference to FIGS. 10 and 11.

Figure 10:
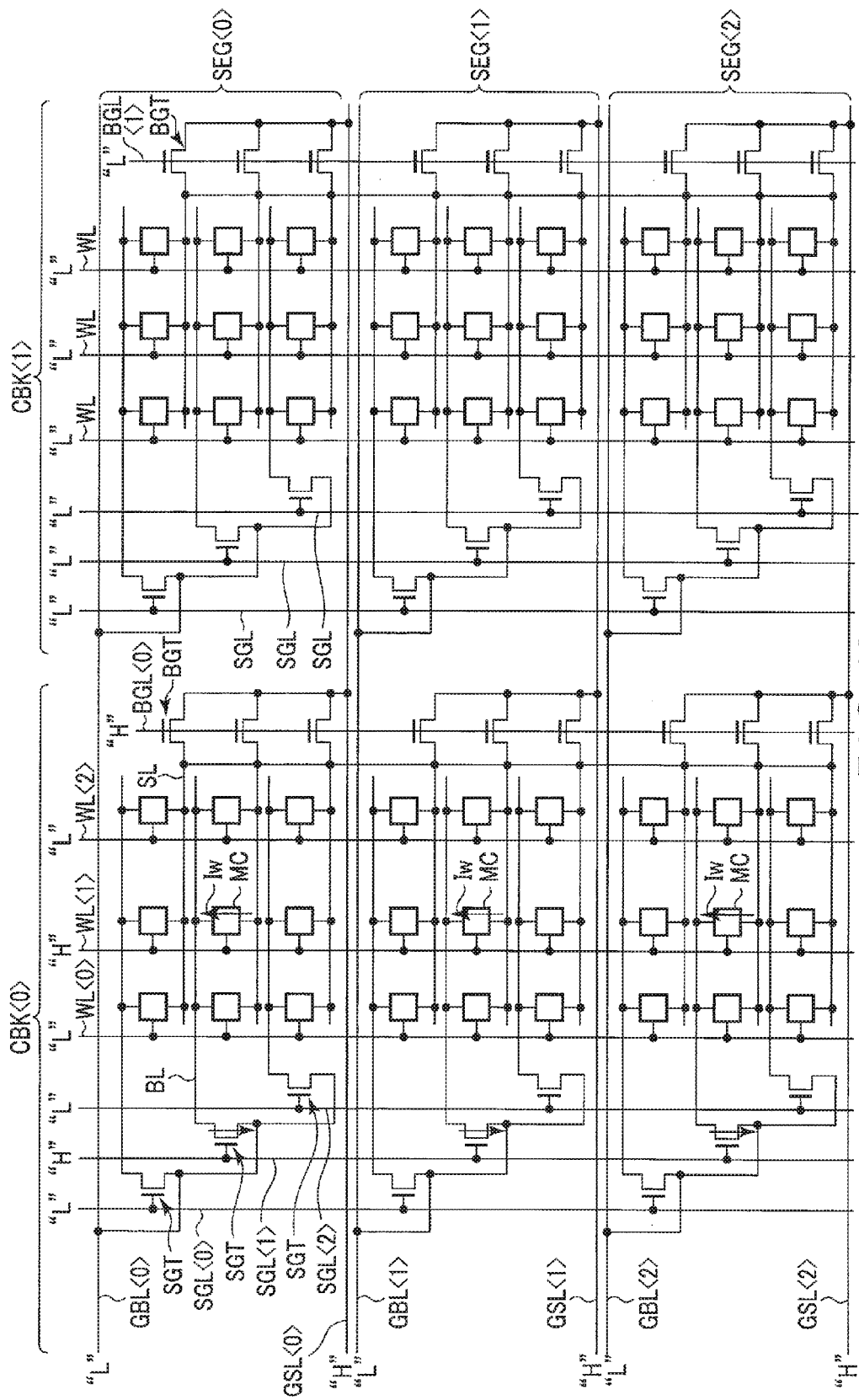
FIG. 10 is a schematic view illustrating an operation example of the variable resistance memory according to the first embodiment.
Figure 11:
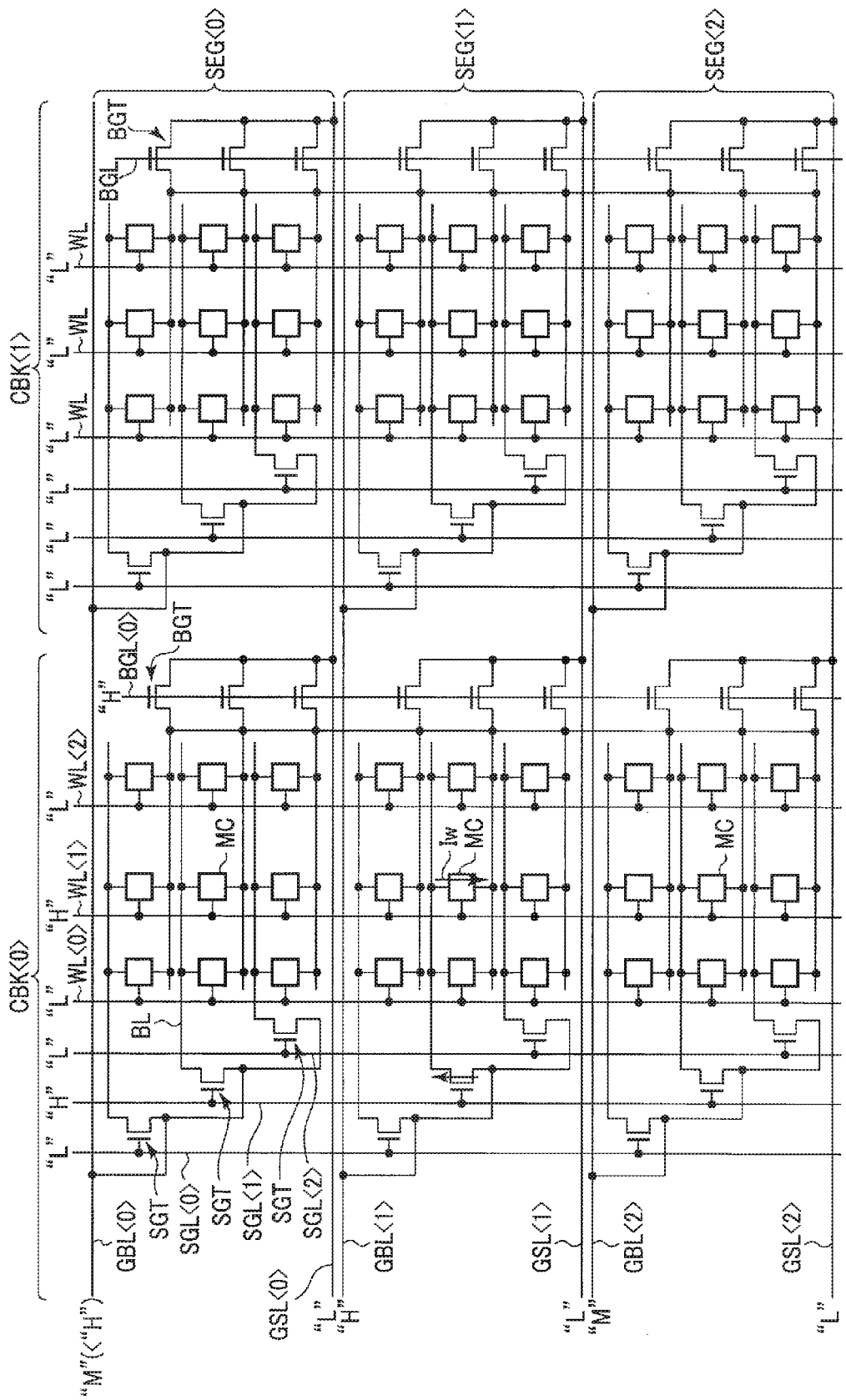
FIG. 11 is a schematic view illustrating an operation example of the variable resistance memory according to the first embodiment.

FIGS. 10 and 11 are schematic diagrams illustrating a write operation of the variable resistance memory according to the present embodiment. In the memory cell array in FIGS. 10 and 11, for simplification of illustration and description, two cell blocks CBK and three segments SEG are shown.

In FIGS. 10 and 11, two block gate lines BGL<0>, BGL<1> are shown. Three global bit lines GBL and three global source lines GSL are shown.

In each of the cell blocks CBK<0>, CBK<1>, three word lines WL (WL<0>, WL<1>, WL<2>), three bit lines BL (BL<0>, BL<1>, BL<2>), and three select gate lines SGL (SGL<0>, SGL<1>, SGL<2>) are shown.

A plurality of memory cells MC in one cell block CBK are connected to a common source line SL even if the memory cells MC are connected to different global bit lines GBL.

Here, the description of the above dummy interconnect is omitted.

A write operation of the variable resistance memory will be described below.

The memory controller 200 sends write commands, addresses, control signals, and data to the variable resistance memory 1 in response to a request from the host (user) during a write operation for the variable resistance memory according to the present embodiment.

In the variable resistance memory 1, the sequencer 15 starts a write operation based on control signals and commands.

The voltage generator 14 generates various voltages for the write operation and supplies the generated voltages to each of the circuits 17 to 21.

An address ADR is transferred from the command-address latch circuit 13 to the column decoder 16 and the row decoder 18. Data DT from outside is transferred to the write circuit 20 via the I/O circuit 12.

Based on the selected address ADR from outside, the potential of each interconnect in the memory cell array 11 is controlled.

To select, for example, as shown in FIG. 10, the cell block CBK (here, the cell block CBL<0>) indicated by the selected address ADR among a plurality of cell blocks in the memory cell array 11, an H(high)-level voltage is applied to the block gate line BGL indicated by the selected address ADR as a selected voltage. An L(low)-level voltage is applied to the non-selected block gate line BGL in the non-selected cell block CBK<1>.

Accordingly, in the selected cell block CBK<0>, the block gate transistor BGT connected to the selected block gate line BGL is turned on. On the other hand, in the non-selected cell block CBK<1>, the block gate transistor BGT connected to the non-selected block gate line BGL is turned off.

In FIG. 10, a plurality of block gate transistors BGT in the same cell block CBK (in the same semiconductor region 101) are connected to a common block gate line BGL. Thus, even if block gate transistors are connected to different global source lines GSL (block gate transistors belonging to different segments SEG), the block gate transistors in the same cell block CBK (block gate transistors connected to the same common source line SL) BGT are turned on.

To select a word line in the memory cell array 11, the H-level voltage is applied to the word line WL (here, the word line WL<1>) indicated by the selected address ADR as the selected voltage and the L-level voltage is applied to the non-selected word line WL.

Accordingly, the cell transistor 4 of the memory cell MC connected to the selected word line WL<1> is turned on and the cell transistors 4 of the memory cells connected to the non-selected word lines WL<0>, WL<2> are turned off.

Even if memory cells are connected to different global bit lines GBL and local bit lines BL, the memory cell MC connected to the selected word line WL<1> in the selected cell block CBK<0> is activated.

To select, for example, the local bit line BL of the memory cell array 11, the H-level voltage is applied to the select gate line SGL (here, the select gate line SGL<1>) corresponding to the selected bit line BL and the L-level voltage is applied to the non-selected select gate line SGL.

Accordingly, the select gate transistor SGT connected to the selected select gate line SGL<1> is turned on. On the other hand, the select gate transistors SGT connected to the non-selected select gate lines SGL<0>, SGL<2> are turned off.

Even if the select gate transistors SGT are connected to different global bit lines GBL (select gate transistors belonging to different segments), the select gate transistor SGT connected to the selected select gate line SGL<1> in the selected cell block CBK<0> is turned on. Accordingly, only the bit line BL corresponding to the selected select gate line SGL<1> is selectively connected to the global bit line GBL via the select gate transistor SGT that is turned on.

In this manner, a plurality of memory cells MC corresponding to the selected block gate line GBL<0>, the selected word line WL<1>, and the selected select gate line SGL<1> become accessible.

However, the order of activating the selected block gate line BGL, the selected word line WL, and the selected select gate line SGL is not limited to the above order.

In the present embodiment, a write operation of the variable resistance memory includes writing data twice.

In the first data writing (in the present embodiment, called an initialization operation or an erase operation), the same data is written into all memory cells connected to the selected word line WL and the selected select gate line SGL in the selected cell block CBK. In the second data writing, data from outside is written into the memory cell indicated by the selected address.

As shown in FIG. 10, in the first data writing of the write operation, while a plurality of memory cells connected to the selected word line WL<1> are turned on, the potential of all the global source lines GSL in the selected cell block CBK<0> is set to the H-level and the potential of all the global bit lines GBL in the selected cell block CBK<0> is set to the L-level.

Accordingly, a write current Iw flows to the memory cells MC corresponding to the selected word line WL<1> and the selected select gate line SGL<1> in the direction from the common source line SL toward the bit line BL.

The same data (for example, "0" data) is written into the memory cells to which the write current Iw is supplied.

For the memory cells MC connected to bit lines corresponding to the non-selected select gate lines SGL<0>, SGL<2>, the select gate transistor SGT is turned off. Thus, even if the memory cell MC corresponding to the non-selected select gate lines SGL<0>, SGL<2> is connected to the selected word line WL<1>, the write current Iw does not flow into the non-selected memory cell MC.

Accordingly, if the memory cell MC has the structure in FIG. 3 (or FIG. 4), the MTJ element 3 is in a "0" data holding state in all memory cells connected to the selected bit line BL and the selected word line WL.

After the first data writing (initialization/erase operation), the second data writing is performed to write data from outside into memory cells (write cells) connected to the selected global bit line GBL<1>.

As shown in FIG. 11, the H-level voltage is applied to the global bit line GBL<1> corresponding to the memory cell into which data from outside is to be written (or the memory cell to be restored to a state before "0" is written) MC.

The L-level voltage is applied to all the global source lines GSL in the cell block CBK.

A voltage of an intermediate potential (M level) lower than the H level is applied to the global bit lines GBL<0>, GBL<2> corresponding to the memory cells MC into which no data from outside is to be written. The non-selected global bit lines GBL<0>, GBL<2> are precharged by the M-level potential being applied to the non-selected global bit lines GBL<0>, GBL<2>. Accordingly, the period secured between the completion of the current write operation and the start of the next operation can be shortened. For example, the current value of a current flowing due to a potential difference between the intermediate level and the L level is sufficiently smaller than the current value of the write current Iw (magnetization reversal threshold of the storage layer). Therefore, even if a potential is applied to the non-selected global bit lines GBL<0>, GBL<2>, erroneous writing of data into non-selected cells hardly occurs.

Due to a potential difference between the global bit line GBL<1> at the H level and the global source line GSL<1> at the L level, the write current Iw flows into the memory cell (write cell) MC via the select gate transistor SGT and the block gate transistor BGT that are turned on.

The write current Iw flows through the MTJ element 3 in a direction from the bit line BL toward the common source line SL.

Accordingly, for the selected cell MC connected to the selected global bit line GBL<1> in the selected cell block CBK<0>, the data holding state of the MTJ element 3 changes from the "0" data holding state to the "1" data holding state.

The select gate transistor SGT is turned off in a plurality of memory cells connected to the selected word line WL<1> and the non-selected bit line BL and thus, the write current Iw does not flow into the memory cell MC connected to the selected word line and non-selected bit line.

In this manner, predetermined data is selectively written into the memory cell MC indicated by the selected address. This completes the second data writing in the variable resistance memory according to the present embodiment.

Then, the sequencer 15 causes the potentials of the selected global bit line GBL, the selected select gate line SGL, the selected block gate line BGL, and the selected word line WL to transition from the H level to the L level at a predetermined timing. Also, the sequencer 15 causes the potential of the non-selected global bit lines to transition from the intermediate level to the L level.

The write operation including writing data twice in the variable resistance memory according to the present embodiment is completed.

As described above, even if, like in the present embodiment, the plurality of memory cells MC in the cell block CBK are configured to be connected to the common source line (provided in the common semiconductor region), predetermined data can be written into the selected cell MC.

<Read Operation>

A read operation of the variable resistance memory according to the present embodiment will be described with reference to FIG. 12.

Figure 12:
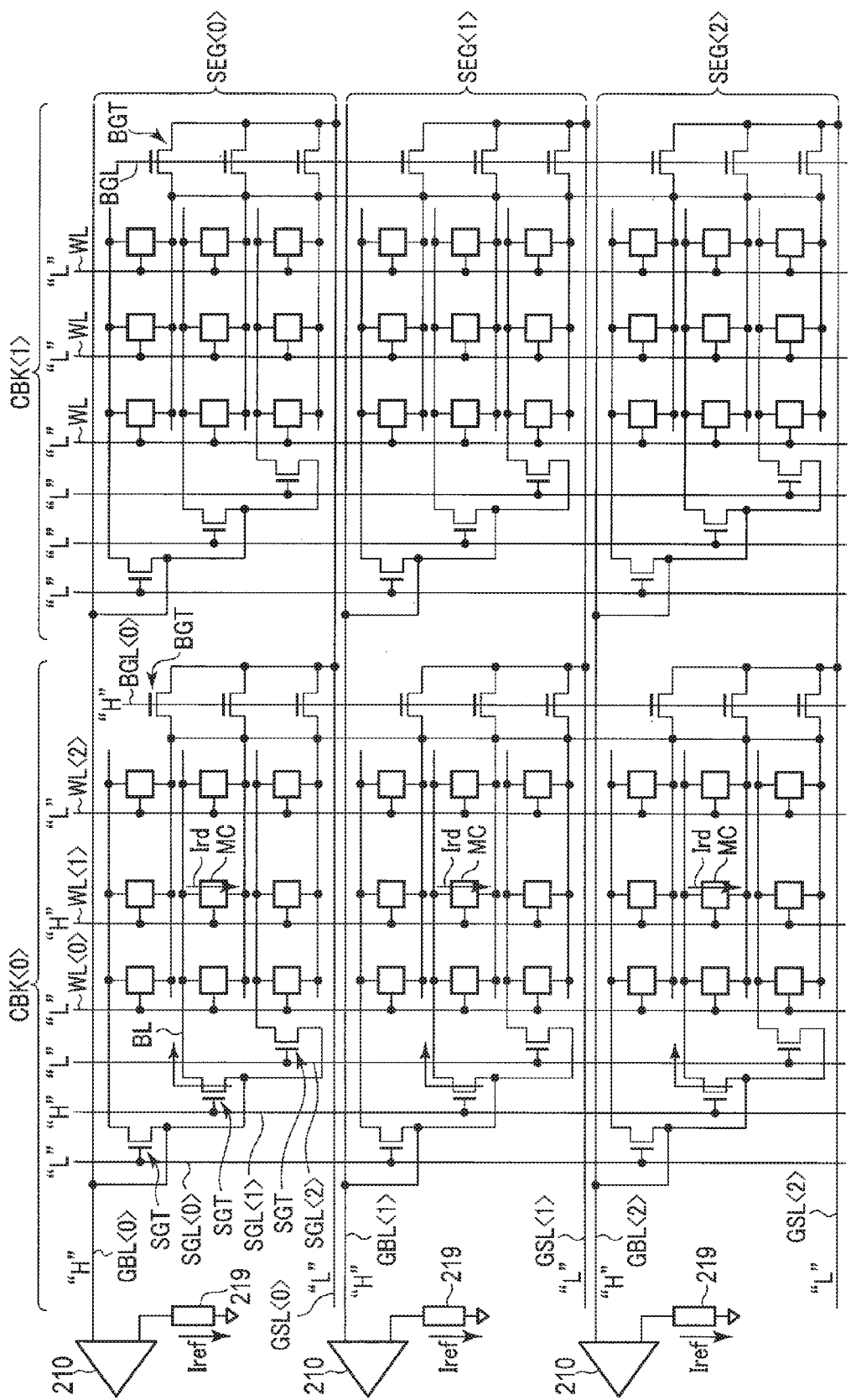
FIG. 12 is a schematic view illustrating an operation example of the variable resistance memory according to the first embodiment.

FIG. 12 is a schematic diagram illustrating a read operation of the variable resistance memory according to the present embodiment.

The sequencer 15 starts a read operation based on read commands, addresses, and control signals from the memory controller 200 during a read operation for the variable resistance memory according to the present embodiment.

The sequencer 15 activates the read circuit 21 during the read operation. Accordingly, one input terminal of a sense amplifier 210 in the read circuit 21 is connected to the global bit line GBL. The other input terminal of the sense amplifier 210 is connected to a reference circuit (reference cell). A reference current (or a reference voltage) Iref is supplied to the other terminal of the sense amplifier by the reference circuit 219.

Based on the selected address, the potential of the selected global bit line GBL is set to the H level and the potential of the selected global source line SL is set to the L level.

Like in the write operation, the H-level voltage is applied to the selected block gate line BGL<0>, the selected select gate line SGL<1>, and the selected word line WL<1>. Also, the L-level voltage is applied to the non-selected block gate line BGL, the non-selected select gate line SGL, and the non-selected word line WL.

The block gate transistor BGT connected to the selected block gate line GBL<0>, the select gate transistor SGT connected to the selected select gate line SGL<1>, and the cell transistor 4 connected to the selected word line WL<1> are turned on.

Incidentally, after the H-level voltage is applied to the selected word line WL, the H-level voltage may be applied to the selected global bit line GBL.

After the H-level voltage is applied to the selected block gate line BGL and the selected select gate line SGL, the H-level voltage may be applied to the selected word line WL. Conversely, after the H-level voltage is applied to the selected word line WL, the H-level voltage may be applied to the selected block gate line BGL and the selected select gate line SGL.

The read current (cell current) Ird flows to the memory cell MC corresponding to the selected address by the selected global bit line GBL being connected to the global source line GSL via the transistor 4, SGT, and BGT that are turned on.

The sense amplifier 210 compares the read current Ird and the reference current Iref.

If the MTJ element 3 is in a low-resistance state (for example, the "0" data holding state), the current value of the read current Ird is larger than that of the reference current Iref.

If the MTJ element 3 is in a high-resistance state (for example, the "1" data holding state), the current value of the read current Ird is smaller than that of the reference current Iref.

Thus, data stored in the memory cell MC is read by magnitudes of the read current and the reference current being determined in this manner.

The data read from the memory cell MC is output from the sense amplifier 210 to a latch circuit (not shown) in the read circuit.

The data in the latch circuit is output from the I/O circuit 12 to the memory controller 200 at a predetermined timing based on the control of the sequencer 15.

As described above, the variable resistance memory according to the present embodiment can perform a read operation.

(d) Summary

As described above, a variable resistance memory according to the present embodiment includes a plurality of select gate transistors SGT to select a memory cell in a control unit. One select gate transistor is provided in a memory cell array so as to correspond to one bit line (local bit line). A select gate line is connected to the gate of the select gate transistor SGT.

In the present embodiment, the plurality of select gate transistors SGT are provided in the semiconductor region 102 extending in an oblique direction in a plane parallel to the surface of a semiconductor substrate. The plurality of select gate transistors SGT are arranged in an oblique direction so as to go along the extending direction of the semiconductor region 102.

Accordingly, the plurality of select gate lines SGL can be laid out, like the word lines WL, in a periodic pattern (for example, a line and space pattern) having a predetermined pitch in the memory cell array of the variable resistance memory according to the present embodiment.

Therefore, the variable resistance memory according to the present embodiment can achieve high integration of select gate transistors in a memory cell array.

Accordingly, in the variable resistance memory according to the present embodiment, patterns of semiconductor regions and interconnects in the memory cell array can be formed without using processing of a high level of difficulty.

As described above, a variable resistance memory including a memory cell array in a hierarchical bit line structure like the present embodiment can achieve high integration of constituting elements in the memory cell array and a lower level of difficulty of processing of the memory cell array.

As a result, a variable resistance memory according to the present embodiment can reduce the cost of manufacturing the resistance change type memory.

(2) Second Embodiment

A variable resistance memory according to the second embodiment will be described with reference to FIGS. 13 and 14.

Figure 13:
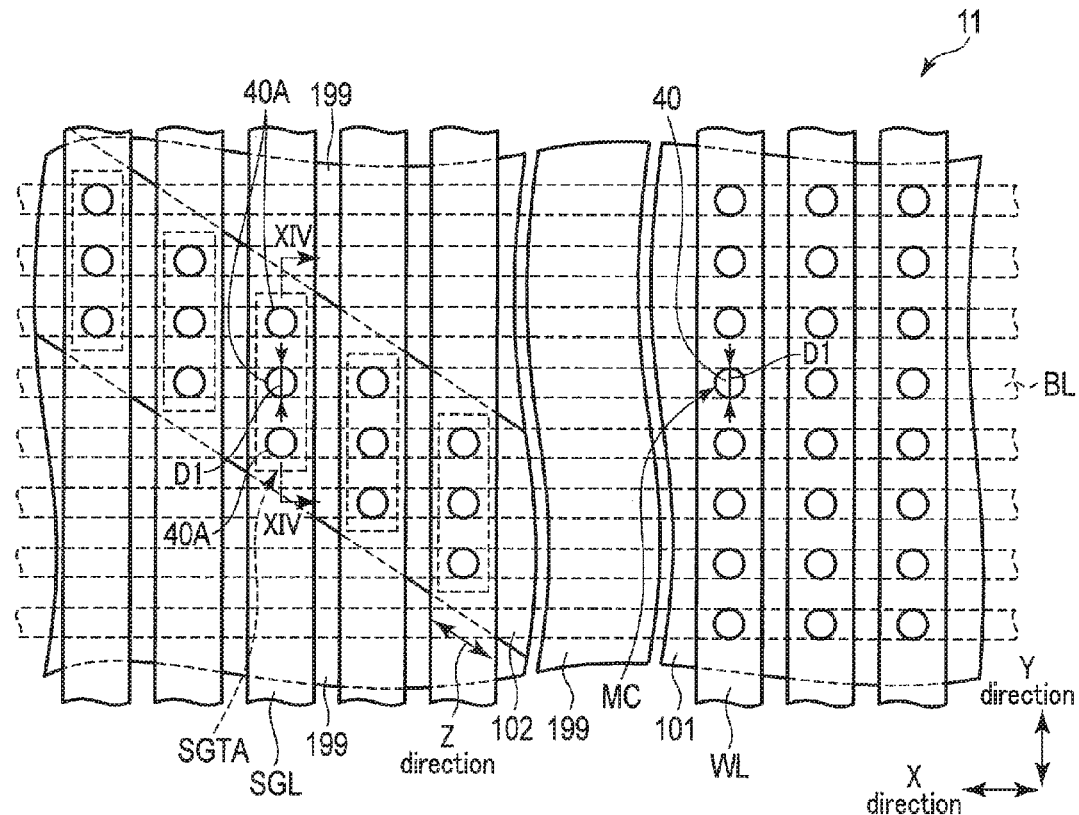
FIG. 13 is a top view showing a structure example of the memory cell array of the variable resistance memory according to a second embodiment.

FIG. 13 is a top view illustrating the structure of the variable resistance memory according to the present embodiment. FIG. 14 is a sectional view illustrating the structure of the variable resistance memory according to the present embodiment. FIG. 14 corresponds to a cross section along a XIV-XIV line in FIG. 13.

A select gate transistor SGTA may include a plurality of semiconductor portions 40A.

Figure 14:
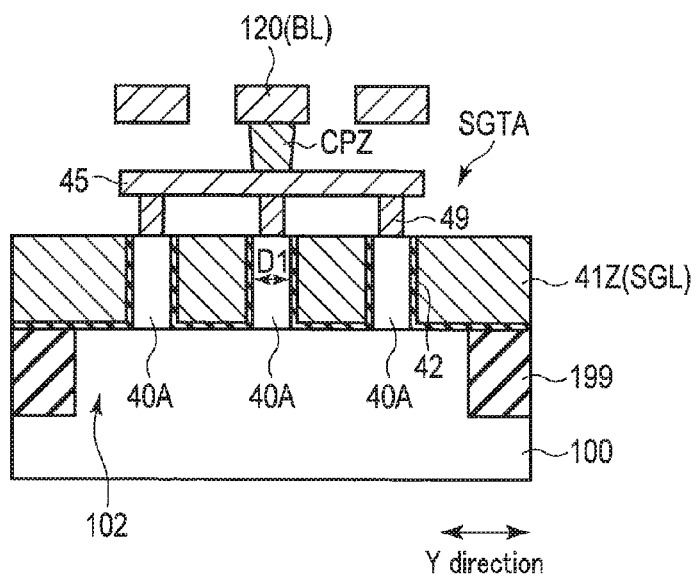
FIG. 14 is a sectional view showing a structure example of the memory cell array of the variable resistance memory according to the second embodiment.

In the present embodiment, as shown in FIGS. 13 and 14, one select gate transistor SGTA includes a plurality of semiconductor portions 40A arranged in the Y direction. The semiconductor portion 40A is formed simultaneously with the semiconductor portion 40 of the cell transistor 4. Regarding dimensions (for example, the diameter or the length of a diagonal line) of the members 40, 40A in a direction parallel to the surface of the semiconductor substrate 100, the dimension of the top end of the semiconductor portion 40A is substantially the same as a dimension D1 of the top end of the semiconductor portion 40.

In one select gate transistor SGTA, top ends of the plurality of semiconductor portions 40A are connected to a common interconnect (metal film) 45.

In the X direction, for example, a portion of the plurality of semiconductor portions 40A in one select gate transistor SGTA is adjacent to the plurality of semiconductor portions 40A in other select gate transistors SGTA.

If one select gate transistor SGTA includes the plurality of semiconductor portions 40A like in the present embodiment, the effective channel width of the vertical type transistor as the select gate transistor SGTA increases.

As a result, in the variable resistance memory according to the present embodiment, the select gate transistor SGTA can supply a relatively large current (for example, a write current) to the memory cell MC.

As described above, a variable resistance memory according to the present embodiment can improve operation characteristics of the memory.

(3) Third Embodiment

A variable resistance memory according to the third embodiment will be described with reference to FIGS. 15 and 16.

FIG. 15 is a top view illustrating the structure of the variable resistance memory according to the present embodiment. FIG. 16 is a sectional view illustrating the structure of the variable resistance memory according to the present embodiment. FIG. 16 corresponds to a cross section along a XVI-XVI line in FIG. 15.

The shape of a semiconductor portion of a select gate transistor may be different from that of a cell transistor.

In the present embodiment, as shown in FIGS. 15 and 16, a semiconductor portion 40B of a select gate transistor SGTB has a rectangular plane shape when viewed from a direction (V direction) perpendicular to the surface of a semiconductor substrate 100.

A dimension D2 in the Y direction of the semiconductor portion 40B is longer than a dimension D3 in the X direction of the semiconductor portion 40B. The dimension D2 of the semiconductor portion 40B is longer than a dimension D1 of a semiconductor portion 40. For example, the dimension D3 of the semiconductor portion 40B is equal to or longer than the dimension D1 of the semiconductor portion 40. Thus, the dimensions (area) of the semiconductor portion 40B are different from those of the semiconductor portion 40.

Incidentally, the plane shape of the semiconductor portion 40B may be elliptic. A semiconductor portion in an elliptic shape has a major axis direction in the Y direction.

A portion of the certain semiconductor portion 40B of a plurality of the semiconductor portions 40B arranged in the Z direction is adjacent to a portion of the other semiconductor portion 40B in the X direction.

In the variable resistance memory according to the present embodiment, the select gate transistor SGTB can increase the effective channel width of the vertical type transistor as the select gate transistor SGTB without increasing the number of interconnects.

As a result, in the variable resistance memory according to the present embodiment, the select gate transistor SGTB can supply a relatively large current (for example, a write current) to the memory cell MC.

As described above, a variable resistance memory according to the present embodiment can improve operation characteristics of the memory.

(4) Modification

A modification of the variable resistance memory according to the embodiment will be described with reference to FIG. 17.

Figure 17:
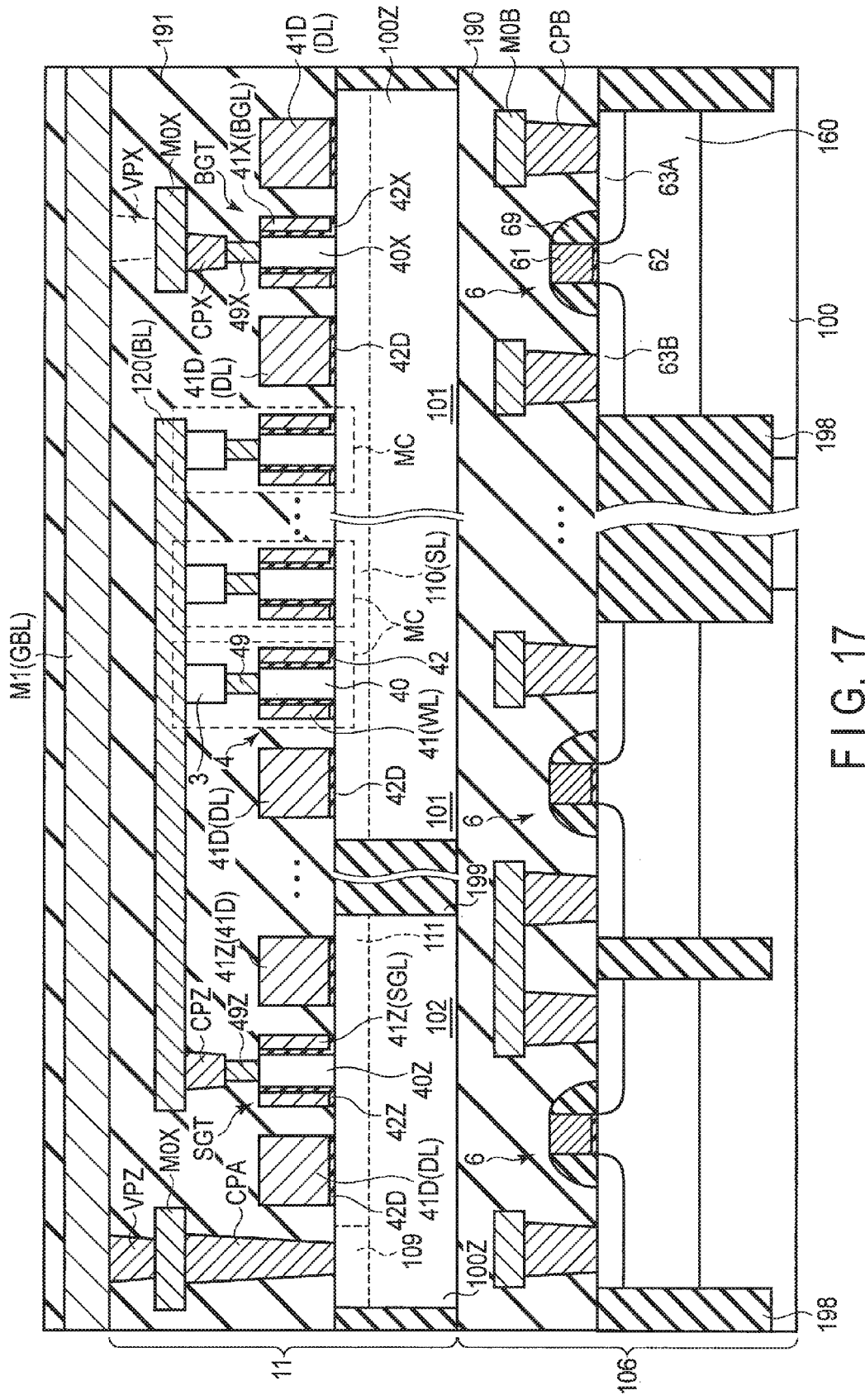
FIG. 17 is a sectional view showing a structure example of the memory cell array of the variable resistance memory according to a modification of the embodiment.

FIG. 17 is a sectional view illustrating the structure of the modification of the variable resistance memory according to the present embodiment.

In the modification of the variable resistance memory, as shown in FIG. 17, a memory cell allay 11 may be disposed on an interlayer insulating film 190 covering the surface of a semiconductor substrate 100.

In this case, a plurality of transistors 6 of the peripheral circuit is disposed on the semiconductor substrate 100.

The memory cell array 11 is stacked above the transistors 6 via the interlayer insulating film 190.

The memory cell array 11 is covered with an interlayer insulating film 191 on the interlayer insulating film 190.

The memory cell array 11 is connected to the transistors 6 via interconnects (not shown) in the interlayer insulating films 190 and 191.

For example, the cell transistor 4 the select gate transistor SGT are formed by using semiconductor layers (semiconductor thin films) 100Z disposed on the interlayer insulating film 190. Each of the cell transistor 4 and the select gate transistor SGT is a vertical type thin film transistor.

In order to an increasing of a current drive ability (output current) of the cell transistor 4 and the select gate transistor SGT, a process (for example, a MILC: metal induced lateral crystallization) for an improvement of a crystalline quality of the semiconductor layer 100Z may be performed to the semiconductor layer 100Z on the interlayer insulating film 190.

The bottom portion of the isolation insulating film 199 is in contact with the top portion of the interlayer insulating film 190.

The select gate region 102 is independent from the cell block region 101.

As described above, in the modification, the memory cell array 11 is stacked above the peripheral circuit (transistors 6) via the interlayer insulating film 190 in a direction (V direction) perpendicular to the surface of the semiconductor substrate 100.

As a result, the variable resistance memory according to the modification of the present embodiment can increase the occupation ratio of the memory cell in the chip of the variable resistance memory and reduce the cost (bit cost) of manufacturing the resistance change type memory.

(5) Other

A variable resistance memory according to an embodiment can be manufactured using the known film deposition technology, crystal growth technology, and etching technology.

In a variable resistance memory according to an embodiment, a magnetoresistive effect element is used as a memory element. However, the memory element used for a variable resistance memory according to an embodiment may be a transition metal oxide type variable resistance element (for example, a nickel oxide film or a titanium oxide film) or a phase change element (for example, a film including a chalcogenide film).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A variable resistance memory comprising:
    first and second diffusion regions provided in first and second semiconductor regions of a semiconductor layer, respectively;
    a first memory cell provided on the first diffusion region, the first memory cell including a first transistor and a first memory element, the first transistor having a first gate connected to a word line, and the word line extending in a first direction parallel to a surface of the semiconductor layer; and
    a second transistor provided on the second diffusion region and connected to one end of the first memory cell via a first bit line, the first bit line extending in a second direction parallel to the surface of the semiconductor layer, and the second direction intersecting the first direction,
    wherein:
    the second semiconductor region extends in a third direction parallel to the surface of the semiconductor layer, and the third direction extends between the first and second directions in a same plane and intersects the first and second directions, the first transistor includes a first semiconductor portion extending in a fourth direction perpendicular to the surface of the semiconductor layer, the first gate is provided on a first gate insulating film on a side face in the second direction of the first semiconductor portion, a first terminal of the first transistor is provided on a side of the first diffusion region of the first semiconductor portion, a second terminal of the first transistor is provided on an opposite side of the first terminal in the fourth direction of the first semiconductor portion, the memory element is provided above the first semiconductor portion in the fourth direction and connected to the second terminal, the second transistor includes a second semiconductor portion extending in the fourth direction, a gate of the second transistor is provided on a second gate insulating film on the side face in the second direction of the second semiconductor portion, a third terminal of the second transistor is provided on the side of the second diffusion region of the second semiconductor portion, a fourth terminal of the second transistor is provided on the opposite side of the third terminal in the fourth direction of the second semiconductor portion, and the fourth terminal is connected to the first bit line.

2. The memory of claim 1, wherein a longitudinal direction of the second diffusion region is along the third direction.

3. The memory of claim 1, further comprising:
a second memory cell provided on the first diffusion region, the second memory cell including a third transistor and a second memory element, and the third transistor having a second gate connected to the word line; and
a fourth transistor provided on the second diffusion region and connected to one end of the second memory cell via a second bit line, the second bit line extending in the second direction,
wherein:
the second memory cell is adjacent to the first memory cell in the first direction and the second memory cell is connected to the first memory cell via a portion extending in the first direction of the first diffusion region, and
the fourth transistor is adjacent to the second transistor in the third direction and the third transistor is connected to the second transistor via the second diffusion region.

4. The memory of claim 3, further comprising:
a source line connected to the other end of the first memory cell and the other end of the second memory cell,
wherein the source line is provided in the first diffusion region.

5. The memory of claim 3, further comprising:
a first interconnect extending in the first direction and connected to the gate of the second transistor; and
a second interconnect extending in the first direction and connected to a gate of the fourth transistor, the second interconnect being adjacent to the first interconnect in the second direction.

6. The memory of claim 1, further comprising:
a fifth transistor provided on the first diffusion region and connected to the other end of the first memory cell via a source line,
wherein the source line is provided in the first diffusion region.

7. The memory of claim 1, wherein:
a first dimension in the first direction of the second semiconductor portion is larger than a second dimension in the first direction of the first semiconductor portion.

8. The memory of claim 1, wherein an insulating film is provided between the first diffusion region and the second diffusion region.

9. A variable resistance memory comprising:
a first diffusion region in a first semiconductor region of a semiconductor layer;
a plurality of memory cells arranged on the first diffusion region in a matrix shape along first and second directions parallel to a surface of the semiconductor layer, each memory cell including a first transistor and a first memory element;
a second diffusion region in a second semiconductor region of the semiconductor layer, the second semiconductor region being adjacent to one end side in the second direction of the first semiconductor region;
a plurality of second transistors provided on the second diffusion region;
at least one third transistor provided on the other end side in the second direction of the first diffusion region;
a plurality of bit lines provided above the semiconductor layer and extending in the second direction;
a plurality of word lines provided on the first diffusion region and extending in the first direction; and
a source line provided in the first diffusion region,
wherein:
the plurality of second transistors are arranged along a third direction parallel to the surface of the semiconductor layer,
the third direction extends between the first and second directions on a same plane and intersects the first and second directions,
one of the plurality of bit lines is connected to one end of memory cells arranged along the second direction among the plurality of memory cells,
the plurality of bit lines are connected to one end of the plurality of second transistors in a one-to-one correspondence,
one of the plurality of word lines is connected to a gate of the first transistor in memory cells arranged along the first direction among the plurality of memory cells,
the source line is connected to the other end of the plurality of memory cells, and
one end of a conductive path of the third transistor is connected to the plurality of memory cells via the source line.

10. The memory of claim 9, wherein:
the second diffusion region extends in the third direction, and
a longitudinal direction of the second diffusion region is along the third direction.

11. The memory of claim 9, further comprising:
a plurality of first interconnects provided on the second diffusion region and arranged in the first direction, the plurality of first interconnects extending in the second direction,
wherein the plurality of first interconnects are connected to gates of the plurality of second transistors in a one-to-one correspondence.

12. The memory of claim 9, wherein:
the plurality of memory cells include:
a first memory cell; and a second memory cell adjacent to the first memory cell in the first direction, and the first diffusion region includes:
- a first region above which the first memory cell is provided;
- a second region above which the second memory cell is provided; and
- a third region that connects the first region and the second region.

13. The memory of claim 9, wherein:
the first transistor includes a first semiconductor portion extending in a fourth direction perpendicular to the surface of the semiconductor layer,
a gate of the first transistor is provided on a first gate insulating film on a side face in the second direction of the first semiconductor portion,
a first terminal of the first transistor is provided on a side of the first diffusion region of the first semiconductor portion,
a second terminal of the first transistor is provided on an opposite side in the fourth direction of the first terminal of the first semiconductor portion,
the memory element is provided above the first semiconductor portion in the fourth direction and is connected to the second terminal,
the second transistor includes a second semiconductor portion extending in the fourth direction,
a gate of the second transistor is provided on a second gate insulating film on a side face in the second direction of the second semiconductor portion,
a third terminal of the second transistor is provided on the side of the second diffusion region of the second semiconductor portion,
a fourth terminal of the second transistor is provided on the opposite side of the third terminal of the second semiconductor portion in the fourth direction, and
the fourth terminal is connected to the bit line.

14. The memory of claim 9, wherein:
the first transistor includes a first semiconductor portion extending in a fourth direction perpendicular to the surface of the semiconductor layer,
the second transistor includes a plurality of second semiconductor portions each extending in the fourth direction, and
each of the plurality of second semiconductor portions has a same size as the first semiconductor portion.

15. The memory of claim 9, wherein:
the first transistor includes a first semiconductor portion extending in a fourth direction perpendicular to the surface of the semiconductor layer,
the second transistor includes a second semiconductor portion extending in the fourth direction, and
a first dimension in the second direction of the second semiconductor portion is larger than a second dimension in the second direction of the first semiconductor portion.

16. The memory of claim 9, wherein an insulating film is provided between the first diffusion region and the second diffusion region.

17. A variable resistance memory comprising:
a first diffusion region in a first semiconductor region of a semiconductor layer;
a plurality of memory cells arranged on the first diffusion region in a matrix shape along first and second directions parallel to a surface of the semiconductor layer, each memory cell including a first transistor and a first memory element;
a second diffusion region in a second semiconductor region of the semiconductor layer, the second semiconductor region being adjacent to one end side in the second direction of the first semiconductor region; and
a plurality of second transistors provided on the second diffusion region,
wherein:
the plurality of second transistors are arranged along a third direction parallel to the surface of the semiconductor layer, and
the third direction extends between the first and second directions on a same plane and intersects the first and second directions,
the first transistor includes a first semiconductor portion extending in a fourth direction perpendicular to the surface of the semiconductor layer,
a gate of the first transistor is provided on a first gate insulating film on a side face in the second direction of the first semiconductor portion,
a first terminal of the first transistor is provided on a side of the first diffusion region of the first semiconductor portion,
a second terminal of the first transistor is provided on an opposite side in the fourth direction of the first terminal of the first semiconductor portion,
the memory element is provided above the first semiconductor portion in the fourth direction and is connected to the second terminal,
the second transistor includes a second semiconductor portion extending in the fourth direction,
a gate of the second transistor is provided on a second gate insulating film on a side face in the second direction of the second semiconductor portion,
a third terminal of the second transistor is provided on the side of the second diffusion region of the second semiconductor portion,
a fourth terminal of the second transistor is provided on the opposite side of the third terminal of the second semiconductor portion in the fourth direction, and
the fourth terminal is connected to the bit line.

* * * * *